(12) United States Patent
Hwang et al.

(10) Patent No.: US 10,033,386 B2
(45) Date of Patent: *Jul. 24, 2018

(54) SEMICONDUCTOR CIRCUITS

(71) Applicant: Samsung Electronics Co., Ltd., Suwon-si, Gyeonggi-do (KR)

(72) Inventors: Hyun-Chul Hwang, Suwon-si (KR); Min-Su Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/661,153

(22) Filed: Jul. 27, 2017

(65) Prior Publication Data

US 2017/0324413 A1 Nov. 9, 2017

Related U.S. Application Data

(63) Continuation-in-part of application No. 15/248,099, filed on Aug. 26, 2016, now Pat. No. 9,722,611.

(30) Foreign Application Priority Data

Sep. 1, 2015 (KR) .......................... 10-2015-0123748
Jan. 11, 2016 (KR) .......................... 10-2016-0003181

(51) Int. Cl.
*H03K 19/018* (2006.01)
*H03K 3/037* (2006.01)
(Continued)

(52) U.S. Cl.
CPC ..... *H03K 19/018521* (2013.01); *H03K 3/012* (2013.01); *H03K 3/037* (2013.01); *H03K 3/356121* (2013.01); *H03K 19/20* (2013.01)

(58) Field of Classification Search
CPC .. H03K 3/02332; H03K 3/0372; H03K 3/289; H03K 3/3562; H03K 3/35625;
(Continued)

(56) References Cited

U.S. PATENT DOCUMENTS 6,208,188 B1 3/2001 Shionoya
6,310,501 B1 10/2001 Yamashita
(Continued)

FOREIGN PATENT DOCUMENTS

KR 2001-0113069 A 12/2001

*Primary Examiner* — Vibol Tan
(74) *Attorney, Agent, or Firm* — Harness, Dickey & Pierce, P.L.C.

(57) ABSTRACT

A semiconductor circuit includes a first circuit and a second circuit. The first circuit is configured to generate a voltage level at a first node based on a voltage level of input data, an inverted value of the voltage level at the first node, a voltage level of a clock signal, and a voltage level at a second node; and the second circuit is configured to generate the voltage level at the second node based on the voltage level of input data, an inverted value of the voltage level at the second node, the voltage level of the clock signal, and the inverted value of the voltage level at the first node. When the clock signal is at a first level, the first and second nodes have different logical levels. When the clock signal is at a second level, the first and second nodes have the same logical level.

20 Claims, 25 Drawing Sheets

(51) Int. Cl.
  *H03K 19/0185* (2006.01)
  *H03K 19/20* (2006.01)
  *H03K 3/012* (2006.01)
  *H03K 3/356* (2006.01)

(58) Field of Classification Search
  CPC .............. H03K 3/3565; H03K 3/353; H03K
         3/356104; H03K 3/356026; H03K
         3/356043; H03K 3/35606; H03K 3/037;
         H03K 3/12; H03K 19/017509; H03K
         19/01806; H03K 19/018507; H03K
         19/018521; H03K 19/018571
  See application file for complete search history.

(56) References Cited

U.S. PATENT DOCUMENTS

| | | | |
|---|---|---|---|
| 6,424,181 B1 | 7/2002 | Pogrebnoy | |
| 6,972,605 B1 | 12/2005 | Choe | |
| 7,265,599 B1 | 9/2007 | Pasqualini | |
| 7,365,575 B2 | 4/2008 | Kim | |
| 7,583,123 B2 | 9/2009 | Kanda et al. | |
| 8,008,959 B2 | 8/2011 | Sekine et al. | |
| 8,593,193 B1 | 11/2013 | Bazes | |
| 8,760,208 B2* | 6/2014 | Dike | H03K 3/0375 326/94 |
| 9,035,686 B1* | 5/2015 | Hsu | H03K 3/356104 327/203 |
| 9,098,666 B2 | 8/2015 | Samadi et al. | |
| 9,160,317 B2 | 10/2015 | Singh et al. | |
| 9,203,405 B2 | 12/2015 | Liu et al. | |
| 9,252,754 B2 | 2/2016 | Kim | |
| 9,356,583 B2 | 5/2016 | Liu et al. | |
| 9,397,641 B2* | 7/2016 | Hsu | H03K 3/356104 |
| 9,473,123 B2 | 10/2016 | Kim | |
| 9,531,352 B1 | 12/2016 | Aw | |
| 9,722,611 B2* | 8/2017 | Hwang | H03K 19/018521 |
| 9,742,382 B2* | 8/2017 | Cai | H03K 3/35625 |
| 2008/0024183 A1* | 1/2008 | Kim | H03K 3/356121 327/185 |
| 2012/0268182 A1 | 10/2012 | Lee et al. | |
| 2015/0162910 A1 | 6/2015 | Liu et al. | |
| 2016/0285435 A1 | 9/2016 | Hwang et al. | |
| 2017/0070214 A1* | 3/2017 | Kim | H03K 3/356121 |
| 2017/0302279 A1* | 10/2017 | Hwang | H03K 19/018521 |

* cited by examiner

SEMICONDUCTOR CIRCUITS

CROSS-REFERENCE TO RELATED APPLICATION

This application is a continuation-in-part of prior U.S. application Ser. No. 15/248,099, filed on Aug. 26, 2016, which claims the benefit of Korean Patent Application No. 10-2015-0123748, filed on Sep. 1, 2015 in the Korean Intellectual Property Office, and to Korean Patent Application No. 10-2016-0003181, filed on Jan. 11, 2016 in the Korean Intellectual Property Office, the entire contents of each of which are incorporated herein by reference.

BACKGROUND

Field

Example embodiments relate to semiconductor circuits.

Description of the Related Art

With recent trends toward microfabrication, an increased number of logic circuits are being integrated into a single chip. Accordingly, a unit cell area size of the chip may directly affect the integration level of chips. In addition, the performance of a flip-flop configured to transfer data in a digital system according to clock signals may be directly linked with system performance. Accordingly, implementing relatively high-speed flip-flops may be necessary to implement relatively high-speed systems. However, implementing conventional high-speed flip-flops may increase an area of the flip-flop.

SUMMARY

At least some example embodiments of inventive concepts provide semiconductor circuits having reduced setup time and/or including relatively high performance circuits capable of reducing a data output time.

At least one example embodiment provides a semiconductor circuit comprising: a first circuit configured to generate a voltage level at a first node based on a voltage level of input data, an inverted value of the voltage level at the first node, a voltage level of a clock signal, and a voltage level at a second node; and a second circuit configured to generate the voltage level at the second node based on the voltage level of input data, an inverted value of the voltage level at the second node, the voltage level of the clock signal, and the inverted value of the voltage level at the first node. When the voltage level of the clock signal is at a first level, the first node and the second node have different logical levels. When the voltage level of the clock signal is at a second level, the first node and the second node have the same logical level. The second level is different from the first level.

According to at least some example embodiments, the second circuit may include: a first pull-up transistor connected to the second node, the first pull-up transistor having a gate configured to receive the inverted value of the voltage level at the first node; and a second pull-up transistor connected to the second node in parallel with the first pull-up transistor, the second pull-up transistor having a gate configured to receive the clock signal.

The second circuit further may include: a first pull-down transistor connected to the second node, the first pull-down transistor having a gate configured to receive the inverted value of the voltage level at the second node; and a second pull-down transistor connected to the second node, the second pull-down transistor having a gate configured to receive the input data.

The second circuit may include: a first gate configured to perform an OR operation between the input data and the inverted value of the voltage level at the second node; and a second gate configured to perform a NAND operation between an output of the first gate, the inverted value of the voltage level at the first node, and the clock signal, the second gate being further configured to output a result of the NAND operation to the second node.

The second circuit may include: a first gate configured to perform an OR operation between an enable signal and the inverted value of the voltage level at the second node; and a second gate configured to perform a NAND operation between an output of the first gate, the inverted value of the voltage level at the first node, and the clock signal, the second gate further configured to output a result of the NAND operation to the second node.

The first circuit may include: a first transistor connected to the first node, the first transistor having a gate configured to receive an inverted value of the voltage level of the clock signal, the first transistor being a pull-up transistor; and a second transistor connected between the first node and a ground voltage, the second transistor having a gate configured to receive the inverted value of the voltage level of the clock signal, and configured to transfer the ground voltage to the first node.

The first circuit may further include: a third transistor connected in parallel with the first transistor, the third transistor having a gate configured to receive the voltage level at the first node, and to output the inverted value of the voltage level at the first node; and a fourth transistor connected to the third transistor in series, the fourth transistor having a gate configured to receive the voltage level at the first node, and to output the inverted value of the voltage level at the first node.

The first circuit may further include: a first inverter configured to invert the voltage level at the first node to output the inverted value of the voltage level at the first node.

The first circuit may include: a first gate configured to perform an OR operation between an inverted value of the input data and the voltage level at the first node; and a second gate configured to perform an AND operation between the output of the first gate and the voltage level of the clock signal, the second gate further configured to output a result of the AND operation to the first node.

The first circuit may further include: a third gate configured to perform a NAND operation between the clock signal and the voltage level at the second node, the third gate further configured to output an inverted value of the voltage level of the clock signal.

The first circuit may include: a first gate configured to perform an OR operation between an inverted value of an enable signal and the voltage level at the first node; and a second gate configured to perform an AND operation between an output of the first gate and the clock signal, the second gate further configured to output a result of the AND operation to the first node.

The semiconductor circuit may further include a latch circuit configured to determine a voltage level of an output terminal based on the voltage level of the clock signal and the voltage level at the second node.

The first level may be a logical low level and the second level may be a logical high level.

At least one other example embodiment provides a semiconductor circuit comprising: a first circuit configured to determine a voltage level at a first node based on a voltage level of input data, an inverted value of the voltage level at the first node, a voltage level of a clock signal, and a voltage level at a second node; a second circuit configured to determine the voltage level at the second node based on the voltage level of the input data, an inverted value of the voltage level at the second node, the voltage level of the clock signal, and the inverted value of the voltage level at the first node; and a latch circuit configured to determine a voltage level of an output terminal based on the voltage level of the clock signal and the voltage level at the second node; wherein when the voltage level of the clock signal is at a first level, the first node is at the first voltage level and the second node is at a second voltage level, and the voltage level of the second node is transferred to the output terminal, and the second voltage level is different from the first voltage level.

The latch circuit may be configured to change the voltage level of the output terminal at a positive edge of the voltage level of the clock signal. The first voltage level may be a logical low level.

The second circuit may be further configured to precharge the second node when the clock signal is at the first voltage level. The first circuit may be further configured to discharge the first node when the clock signal is at the first voltage level.

When the voltage level of the clock signal transitions from the first voltage level to the second voltage level, the semiconductor circuit may be configured to change a voltage level at one of the first node and the second node while maintaining the voltage level at the other of the first node and the second node.

At least one other example embodiment provides a semiconductor circuit comprising a first circuit and a second circuit. The first circuit includes: a first transistor having a gate configured to receive inverted value of a voltage level of a clock signal, the first transistor configured to pull up a first node; a second transistor connected between the first node and a ground voltage, the second transistor having a gate configured to receive the inverted value of the voltage level of the clock signal, and to transfer the ground voltage to the first node; a third transistor connected in parallel with the first transistor, the third transistor having a gate configured to receive the voltage level at the first node, and to output an inverted value of the voltage level at the first node; and a fourth transistor connected to the third transistor in series, the fourth transistor having a gate configured to receive the voltage level at the first node, and to output the inverted value of the voltage level at the first node. The second circuit includes: a fifth transistor having a gate configured to receive the inverted value of the voltage level at the first node, and the fifth transistor configured to pull up the second node; a sixth transistor connected in parallel with the fifth transistor, the sixth transistor having a gate configured to receive the a clock signal, and the sixth transistor configured to pull up the second node; a seventh transistor having a gate configured to receive the voltage level at the second node, the seventh transistor configured to pull down a third node; and an eighth transistor having a gate configured to receive input data, the eighth transistor configured to pull down the third node.

The third transistor and the fourth transistor may be configured as an inverter, which inverts the voltage level at the first node to output the inverted value of the voltage level at the first node.

The second circuit may further include: a ninth transistor connected to the third node, the ninth transistor having a gate configured to receive the inverted value of the voltage level at the first node, the ninth transistor configured to pull down the third node; and a tenth transistor connected in series with the ninth transistor, the tenth transistor having a gate configured to receive the clock signal, the tenth transistor configured to pull down the third node.

The semiconductor circuit may further include a latch circuit configured to determine a voltage level of an output terminal based on the voltage level of the clock signal and the voltage level of the input data.

At least one other example embodiment provides a semiconductor circuit, comprising: a first circuit configured to output a first output signal based on input data, a clock signal, a second output signal, and the first output signal; and a second circuit configured to output the second output signal based on the input data, an inverted version of the first output signal, the clock signal, and an version of the second output signal; wherein the second circuit is further configured to output the second output signal having a logic level different from a logic level of the first output signal in response to the clock signal having a first logic level, and the second circuit is further configured to output the second output signal having a same logic level as the first output signal in response to the clock signal having a second logic level.

The semiconductor circuit may further include a latch circuit having an input terminal configured to receive the second output signal from the second circuit.

The semiconductor circuit may further include a multiplexer configured to input the input data to the first and second circuits.

The first circuit may include: a NAND gate configured to output a NAND gate output signal based on the clock signal and the second output signal; an OR gate configured to output an OR gate output signal based on the first output signal and an inverted version of the input data; an AND gate configured to generate the first output signal based on the NAND gate output signal and the OR gate output signal; and an inverter configured invert the first output signal to generate the inverted first output signal.

The second circuit may include: an inverter configured to invert the second output signal to generate the inverted version of the second output signal; an OR gate configured to generate an OR gate output signal based on the input data and the inverted version of the second output signal; and a NAND gate configured to generate the second output signal based on the clock signal, the inverted version of the first output signal, and the OR gate output signal.

BRIEF DESCRIPTION OF THE DRAWINGS

Example embodiments will become more apparent by describing in detail the attached drawings in which.

DETAILED DESCRIPTION

Figure 1:
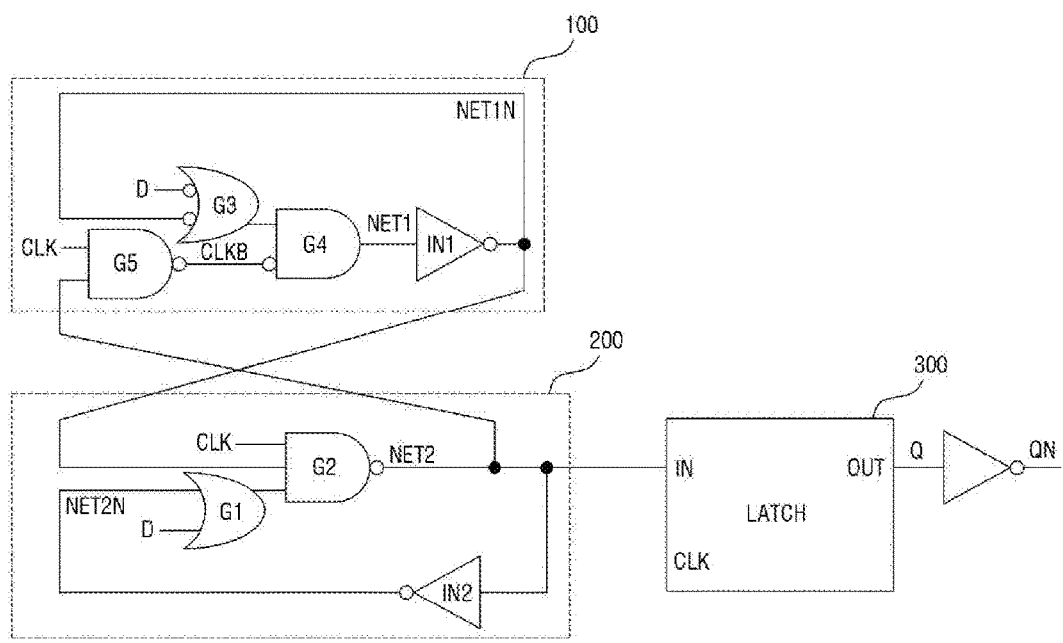
FIG. 1 is a block diagram of a semiconductor circuit according to some example embodiments of inventive concepts.

Inventive concepts will become more readily understood by reference to the following detailed description of example embodiments and the accompanying drawings. Inventive concepts may, however, be embodied in many different forms and should not be construed as being limited to the example embodiments set forth herein. Rather, these example embodiments are provided so that this disclosure will be thorough and complete and will fully convey concept of the inventive concepts to those skilled in the art, and the inventive concepts will only be defined by the appended claims. Like reference numerals refer to like elements throughout the specification.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these example embodiments should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, illustrative embodiments may be described with reference to acts and symbolic representations of operations (e.g., in the form of flow charts, flow diagrams, data flow diagrams, structure diagrams, block diagrams, etc.) that may be implemented as program modules or functional processes including routines, programs, objects, components, data structures, etc., that perform particular tasks or implement particular abstract data types. The operations may be implemented using existing hardware in existing electronic systems (e.g., display drivers, System-on-Chip (SoC) devices, SoC systems, electronic devices, such as personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), SoCs, field programmable gate arrays (FPGAs), computers, or the like.

Further, one or more example embodiments (e.g., controller 1110) may be (or include) hardware, firmware, hardware executing software, or any combination thereof. Such hardware may include one or more CPUs, SoCs, DSPs, ASICs, FPGAs, computers, or the like, configured as special purpose machines to perform the functions described herein as well as any other well-known functions of these elements. In at least some cases, CPUs, SoCs, DSPs, ASICs and FPGAs may generally be referred to as processing circuits, processors and/or microprocessors.

Although a flow chart may describe operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium," may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, at least some portions of example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, processor(s), processing circuit(s), or processing unit(s) may be programmed to perform the necessary tasks, thereby being transformed into special purpose processor(s) or computer(s).

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

Figure 2:
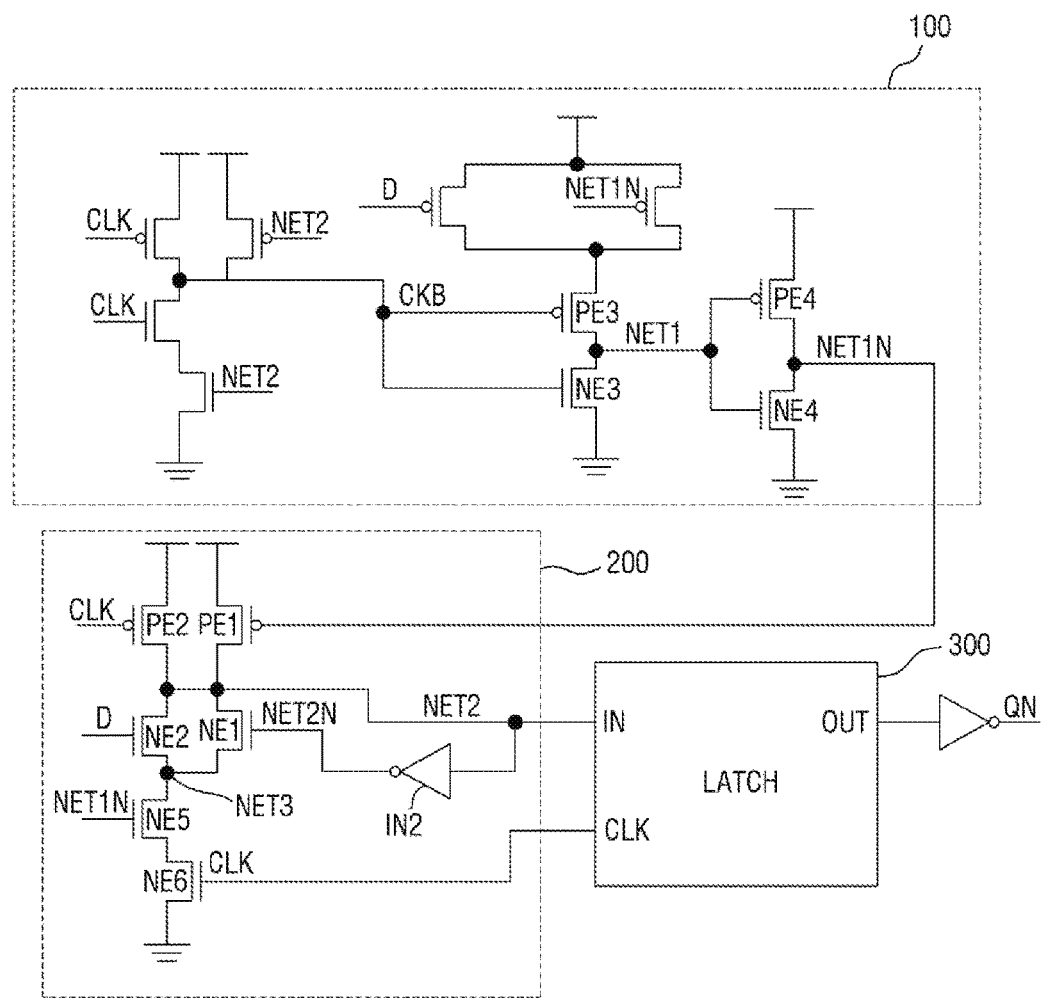
FIG. 2 is a circuit diagram of a semiconductor circuit according to some example embodiments of inventive concepts.
Figure 3:
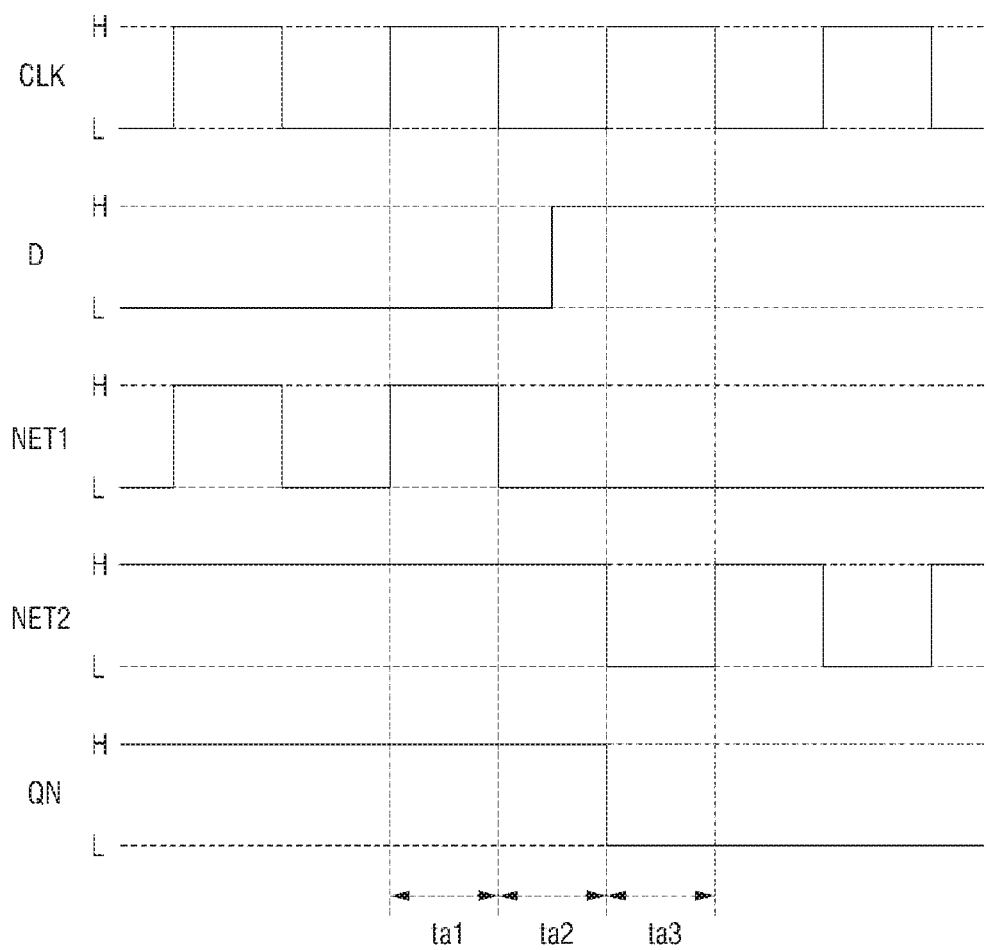
FIG. 3 is a timing diagram for explaining example operation of a semiconductor circuit according to some example embodiments of inventive concepts.

FIG. 1 is a block diagram of a semiconductor circuit according to some example embodiments of inventive concepts, FIG. 2 is a circuit diagram of the semiconductor circuit shown in FIG. 1, and FIG. 3 is a timing diagram for explaining example operation of the semiconductor circuit shown in FIGS. 1 and 2.

Referring to FIGS. 1 and 2, the semiconductor circuit according to some example embodiments of inventive concepts includes a first circuit 100, a second circuit 200, and a latch circuit 300.

The first circuit 100 may determine a voltage level of a first node NET1 based on a voltage level of input data D, a voltage level inverted to the voltage level of the first node NET1, a voltage level of a clock signal CLK, and a voltage level of a second node NET2.

The second circuit 200 may determine the voltage level of the second node NET2 based on the voltage level of input data D, a voltage level inverted to the voltage level of the second node NET2, the voltage level of the clock signal CLK, and a voltage level inverted to the voltage level of the first node NET1.

The latch circuit 300 may determine a voltage level of an output terminal QN based on the voltage level of the clock signal CLK and the voltage level of the second node NET2.

In this example, some of outputs of the first circuit 100 may be used as inputs of the second circuit 200, and some of outputs of the second circuit 200 may be used as inputs of the first circuit 100. The first circuit 100, the second circuit 200, and the latch circuit 300 may function as flip-flops. However, aspects of one or more example embodiments are not limited thereto.

In more detail, the second circuit 200 may include a first gate G1 performing an OR operation between the voltage level of input data D and an inverted value of the voltage level of the second node NET2. The inverted value of the voltage level of the second node NET2 may be transferred as an input value of the first gate G1 by a second inverter IN2.

In addition, the second circuit 200 may include a second gate G2 performing a NAND operation between a voltage level of an output of the first gate G1, an inverted value of the voltage level of the first node NET1, and the voltage level of the clock signal CLK. The second gate G2 transfers an output value of the NAND operation to the second node NET2.

The first circuit 100 may include a third gate G3 performing an OR operation between the voltage level of input data D and the voltage level of the first node NET1. The third gate G3 outputs the output value of the OR operation to a fourth gate G4. The first circuit 100 may include an inverter IN1 that inverts the voltage level of the first node NET1, and outputs the inverted value of the voltage level of the first node NET1 to the third gate G3 as well as the second gate G2.

In addition, the first circuit 100 may include a fourth gate G4 performing an AND operation between a voltage level of an output of the third gate G3 and an inverted value of the inverted voltage level CKB of the clock signal CLK. The fourth gate G4 outputs an output value of the AND operation to the first node NET. The first circuit 100 may include a fifth gate G5 performing a NAND operation between the voltage level of the clock signal CLK and the voltage level of the second node NET2 and outputting the inverted value CKB of the voltage level of the clock signal CLK. The inverted value CKB of the voltage level of the clock signal CLK, which is the output value of the fifth gate G5, may be inverted and then provided as an input value of the fourth gate G4.

Example operations of the first circuit 100 and the second circuit 200 will now be described in more detail.

The output value of the first circuit 100 is provided as an input value of the second circuit 200, and the output value of the second circuit 200 is provided as an input value of the first circuit 100. Accordingly, the first circuit 100 and the second circuit 200 perform operations similar to those of an SR latch circuit. In addition, the first circuit 100 and the second circuit 200 function as circuits for controlling the second circuit 200 and the first circuit 100, respectively. The output value of the second circuit 200 may be transferred to the latch circuit 300, and the second circuit 200 may function as a flip-flop circuit.

The first circuit 100 and the second circuit 200 perform different operations according to the voltage level of the clock signal CLK. In more detail, for example, when the clock signal CLK is at a logical low level, the second node NET2 is pre-charged to a logical high level. Conversely, the first node NET1 is discharged to a logical low level by the fifth gate G5 connecting to the clock signal CLK and the second node NET2. In this example, the first node NET1 and the second node NET2 have different logical levels.

In addition, when the clock signal CLK is at a logical high level, the first node NET1 and the second node NET2 may operate to have the same logical level. For example, when the input data D is at a logical low level L, the second node NET2 is maintained at a logical high level H and the voltage level of the first node NET1 transitions from the logical low level L to the logical high level H. In addition, when the input data D is at a logical high level, the first node NET1 is maintained at a logical low level L and the voltage level of the second node NET2 transitions from the logical high level H to the logical low level L.

According to at least some example embodiments, the logical high level H may refer to a voltage level greater than or equal to a reference level, and the logical low level L may refer to a voltage level less than the reference level. For example, the logical high level H may refer to a voltage level having a value of about 50% or greater and the logical low level L may refer to a voltage level having a value of less than about 50%. However, aspects of example embodiments are not limited to this example. The reference level may vary in various manners. Based on this finding, logical levels of semiconductor circuits will be described with regard to the logical high level H and the logical low level L.

Referring to FIG. 3, in a semiconductor circuit according to some example embodiments of inventive concepts, when the voltage level of the clock signal CLK rises, an inverted value of the voltage level of input data D may be transferred to the output terminal QN. That is, for example, the voltage level of the output node OUT of the latch circuit 300 is inverted by an inverter to determine the voltage level of the output terminal QN.

The voltage level of the output terminal QN may be changed at a positive edge of the voltage level of the clock signal CLK. Consequently, when the clock signal CLK transitions to the logical high level H and the second node NET2 is at the logical low level L, the voltage level of the output terminal QN may be synchronized with the voltage level of the second node NET2 to then be output. However, aspects of example embodiments are not limited to this example.

Example circuit operations in a first section ta1 will now be described in more detail with reference to FIGS. 1 to 3.

In the first section ta1, the input data D is at logical low level L and the clock signal CLK is at logical high level H.

In the second circuit 200, since the voltage level of the clock signal CLK is logical high level H, a transistor PE2 gated to an inverted value of the voltage level of the clock signal CLK is turned on to pre-charge the second node NET2. In this example, the voltage level of the second node NET2 may be logical high level H.

In addition, in the second circuit 200, the first gate G1 performs an OR operation between the voltage level of input data D (e.g., the logical low level L), and the inverted value of the voltage level of the second node NET2 (e.g., the logical low level L), and outputs the resulting logical low level L to the second gate G2.

The second gate G2 performs a NAND operation between the voltage level of the clock signal CLK, the output of the first gate G1 (e.g., the logical low level L) and the voltage level of the first node NET1 (e.g., the logical high level H), and transfers the output value of the NAND operation (e.g., the logical high level H) to the second node NET2.

That is, for example, in a state in which the clock signal CLK is at a logical high level H and the input data D is at logical low level L, the second node NET2 is maintained at a state in which the second node NET2 is pre-charged to the logical high level H, while the first node NET1 transitions from the logical low level L to the logical high level H. Since the second node NET2 is at logical high level H, an input node IN of the latch circuit 300 is pre-charged and the voltage level of the output terminal QN is maintained at the logical high level H.

In a second section ta2, the input data D transitions from the logical low level L to the logical high level H, and the clock signal CLK transitions from the logical high level H to the logical low level L. In the second section ta2, the voltage level of the second node NET2 is maintained at the logical high level H, and the first node NET1 transitions from the logical high level H to the logical low level L.

In a third section ta3, the voltage level of input data D is maintained at the logical high level H, and the clock signal CLK transitions from the logical low level L to the logical high level H. In this example, since the voltage level of the output terminal QN is synchronized with the rising edge of the clock signal CLK to be changed, and the second node NET2 transitions to the logical low level L, the output terminal QN may also transition to the logical low level L so that the voltage level of the output terminal QN is maintained at the logical low level L.

Referring again to FIG. 2, a semiconductor circuit according to some example embodiments of inventive concepts will be described in terms of example transistor connections.

Referring to FIG. 2, in the semiconductor circuit according to some example embodiments of inventive concepts, the second circuit 200 includes a transistor PE1 (e.g., a pull-up transistor) gated to the inverted value of the voltage level of the first node NET1 and pulling up the second node NET2, and a transistor PE2 (e.g., a pull-up transistor) connected in parallel with the transistor PE1, gated to the voltage level of the clock signal CLK and pulling up the second node NET2.

In addition, the second circuit 200 includes a transistor NE1 (e.g., a pull-down transistor) gated to the inverted value of the voltage level of the second node NET2 and pulling down a third node, and a transistor NE2 (e.g., a pull-down transistor) gated to the voltage level of the input data D and pulling down the third node NET3.

The voltage level of the second node NET2 is inverted by the second inverter IN2, and output to the gate of the transistor NE1.

A transistor NE5 and a transistor NE6 may be connected in series, and the transistor NE5 may be connected to the third node NET3. The transistor NE5 (e.g., a pull-down transistor) is gated to the inverted value of the voltage level of the first node NET1 and pulls down the third node NET3. The transistor NE6 is gated to the voltage level of the clock signal CLK and pulls down the third node NET3.

The first circuit 100 may include a transistor PE3 (e.g., a pull-up transistor) gated to the inverted value CKB of the voltage level of the clock signal CLK and pulling up the first node NET1, and a transistor NE3 connected to the transistor PE3 in series, gated to the inverted value CKB of the voltage level of the clock signal CLK and transferring a ground voltage to the first node NET1.

In addition, the first circuit 100 may include a transistor PE4 and a transistor NE4. The transistor PE4 is connected in parallel with the transistor PE3, gated to the voltage level of the first node NET1 and outputs the inverted value of the voltage level of the first node NET1. The transistor NE4 is connected to the transistor PE4 in series, gated to the voltage level of the first node NET1, and outputs the inverted value of the voltage level of the first node NET1.

The transistor PE4 and the transistor NE4 may function as the first inverter IN1 of FIG. 1.

Figure 4:
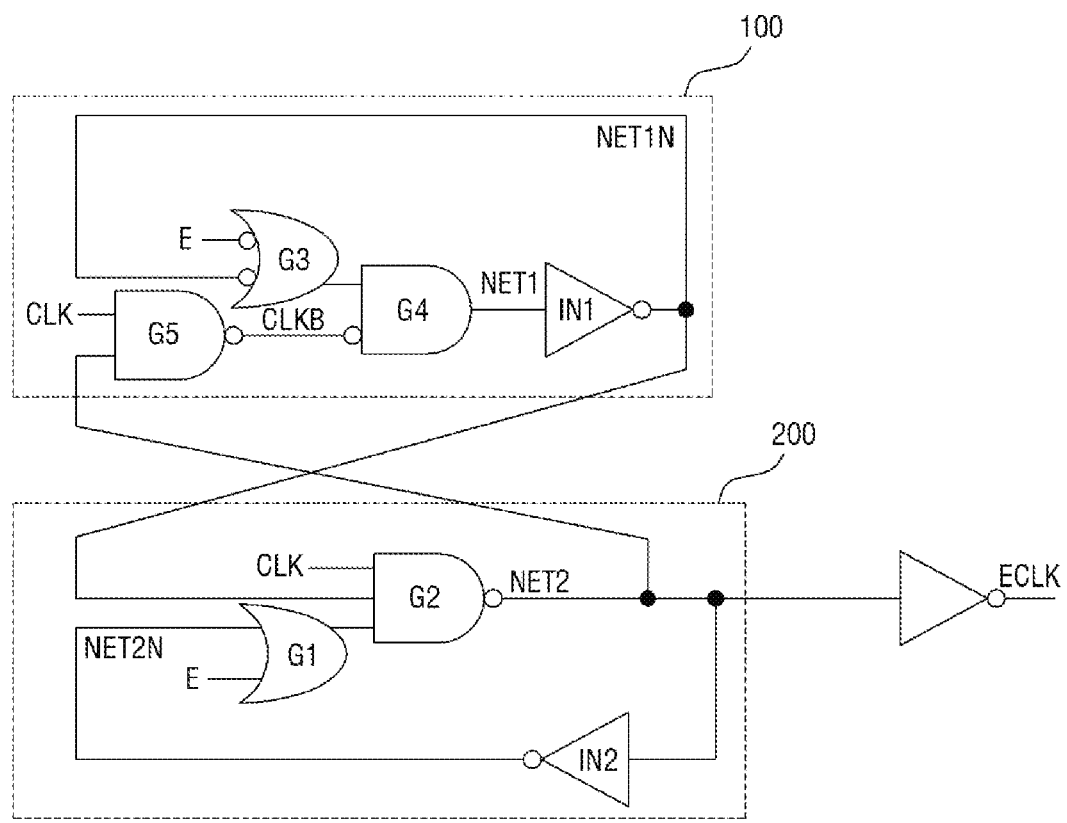
FIG. 4 is a block diagram of a semiconductor circuit according to some example embodiments of inventive concepts.

FIG. 4 is a block diagram of another semiconductor circuit according to some example embodiments of inventive concepts. The semiconductor circuit shown in FIG. 4 is similar to the semiconductor circuit shown in FIG. 1, and thus, repeated descriptions of the same details as those of the example embodiment discussed above will be omitted.

Referring to FIG. 4, the semiconductor circuit according to some example embodiments of inventive concepts includes a first circuit 100 and a second circuit 200.

Unlike in the example embodiment shown in FIG. 1, the semiconductor circuit in FIG. 4 does not include a latch circuit. Therefore, the semiconductor circuit may function as an integrated clock gating circuit, rather than as a flip-flop circuit. In the example embodiment shown in FIG. 4, an enable signal E, rather than the input data D, is input to the gates G1 and G3, and the output of the semiconductor circuit is signal ECLK.

Figure 5:
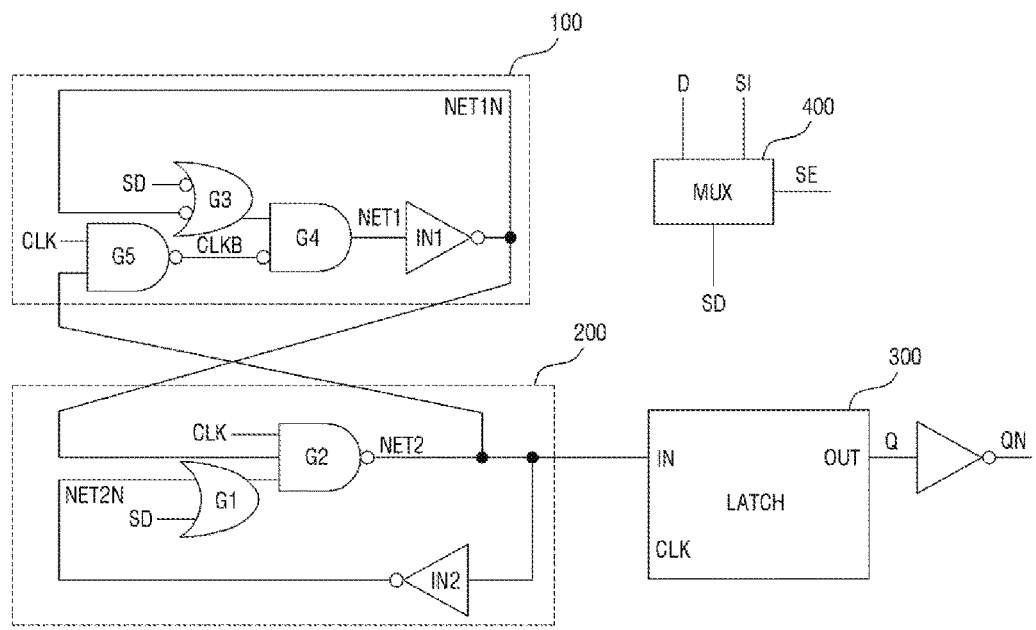
FIG. 5 is a block diagram of a semiconductor circuit according to some example embodiments of inventive concepts.

FIG. 5 is a block diagram of another semiconductor circuit according to some example embodiments of inventive concepts. The semiconductor circuit shown in FIG. 5 is similar to the semiconductor circuit shown in FIG. 1, and thus, repeated descriptions of the same details as those of the example embodiment discussed above will be omitted.

Referring to FIG. 5, the semiconductor circuit according to some example embodiments of inventive concepts includes a first circuit 100, a second circuit 200, a latch circuit 300, and a multiplexer 400.

Compared to the semiconductor circuit shown in FIG. 1, the semiconductor circuit shown in FIG. 5 may function as a flip-flop circuit by additionally including the multiplexer 400 to add a scan test signal.

Figure 6:
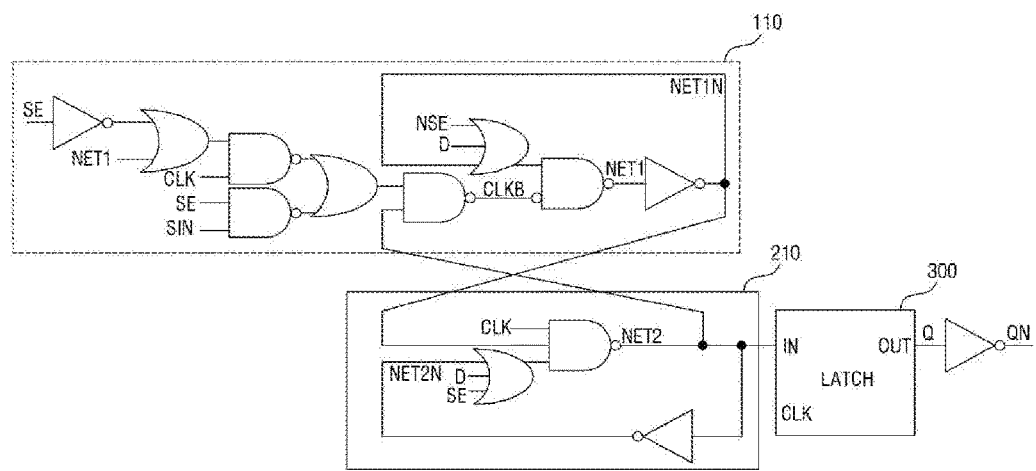
FIG. 6 is a block diagram of a semiconductor circuit according to some example embodiments of inventive concepts.
Figure 7:
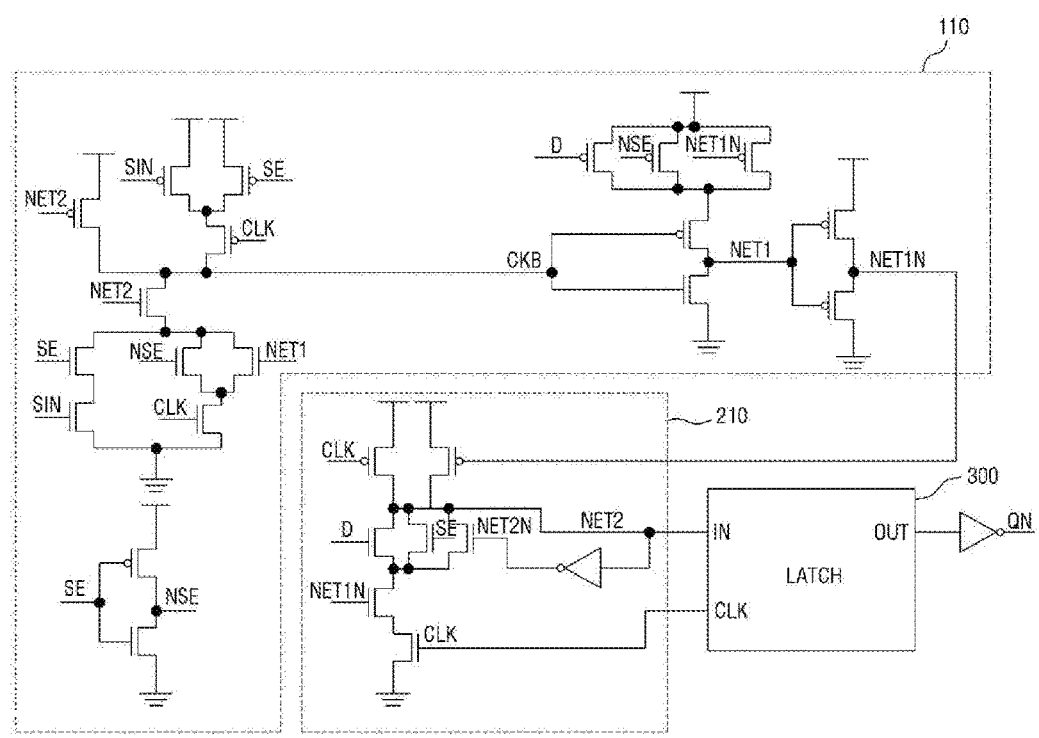
FIG. 7 is a circuit diagram of a semiconductor circuit according to some example embodiments of inventive concepts.

FIG. 6 is a block diagram of yet another semiconductor circuit according to some example embodiments of inventive concepts, and FIG. 7 is a circuit diagram of a semiconductor circuit according to some example embodiments of inventive concepts. The semiconductor circuit shown in FIGS. 6 and 7 is similar to the semiconductor circuit shown in FIGS. 1 and 2. Thus, for brevity, repeated descriptions of the same details as those of the example embodiment shown in FIGS. 1 and 2 will be omitted.

Referring to FIGS. 6 and 7, the semiconductor circuit includes a first circuit 110, a second circuit 210, and a latch circuit 300.

The first circuit 110 is similar to the first circuit 100 shown in FIGS. 1 and 2, but further includes a circuit operating as a scan test path. Accordingly, the first circuit 110 may perform a scan test operation using the added scan test path while reducing and/or minimizing a change in the data path. Transistors additionally installed in the first circuit 110 are illustrated in FIG. 7.

In FIG. 7, flip-flop circuits with scan test paths added are illustrated at the transistor level. Referring to FIG. 7, the added transistors are connected to a node at which an inverted clock signal CKB is generated, and only nodes to which a scan enable signal SE or an inverted scan enable signal SIN is input are connected in parallel with a node to which the input data D is applied.

Figure 8:
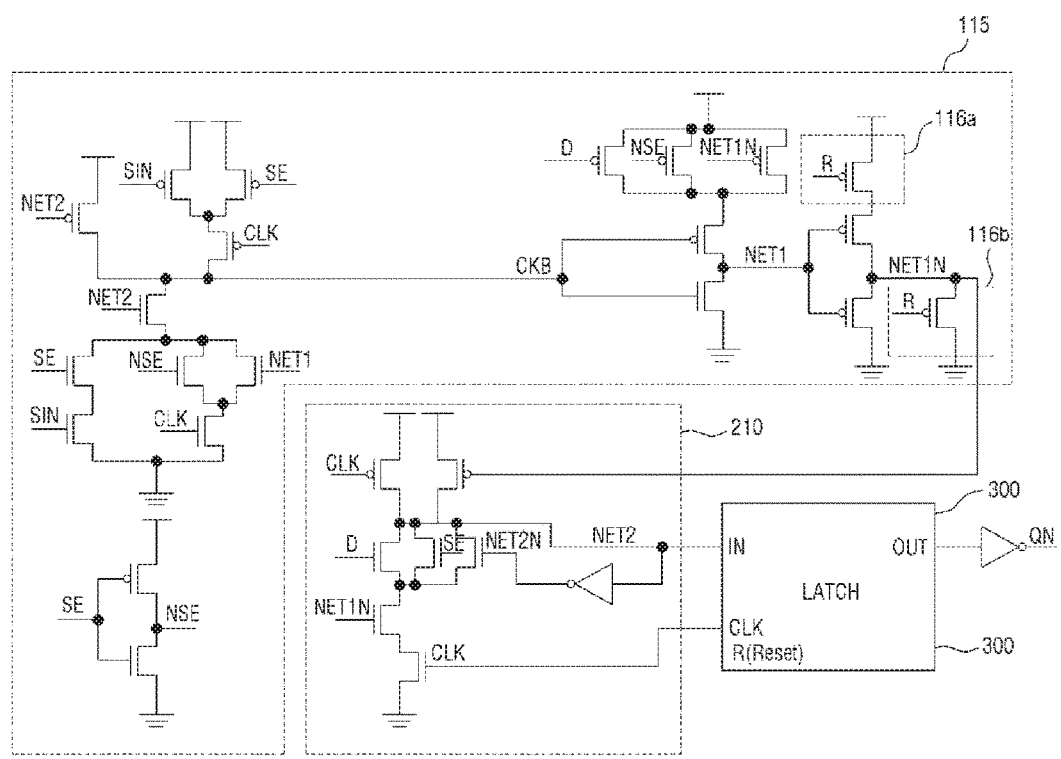
FIG. 8 is a circuit diagram of a semiconductor circuit according to some example embodiments of inventive concepts.

FIG. 8 is a circuit diagram of another semiconductor circuit according to some example embodiments of inventive concepts. The semiconductor circuit shown in FIG. 8 is similar to the semiconductor circuit shown in FIGS. 6 and 7. Thus, repeated descriptions of the same details as those of the example embodiment shown in FIGS. 6 and 7 will be omitted.

Referring to FIG. 8, the semiconductor circuit according to some example embodiments of inventive concepts includes a first circuit 115, a second circuit 210, and a latch circuit 300.

As with the first circuit 110 shown in FIGS. 6 and 7, the first circuit 115 includes a circuit operating as a scan test path. Accordingly, the first circuit 115 may perform a scan test operation using the added scan test path while reducing and/or minimizing a change in the data path. In addition to the circuitry common the first circuit 110 and the first circuit 115, the first circuit 115 may further include transistors 116*a* and 116*b* to which a reset signal R is input to perform a reset operation.

Figure 9:
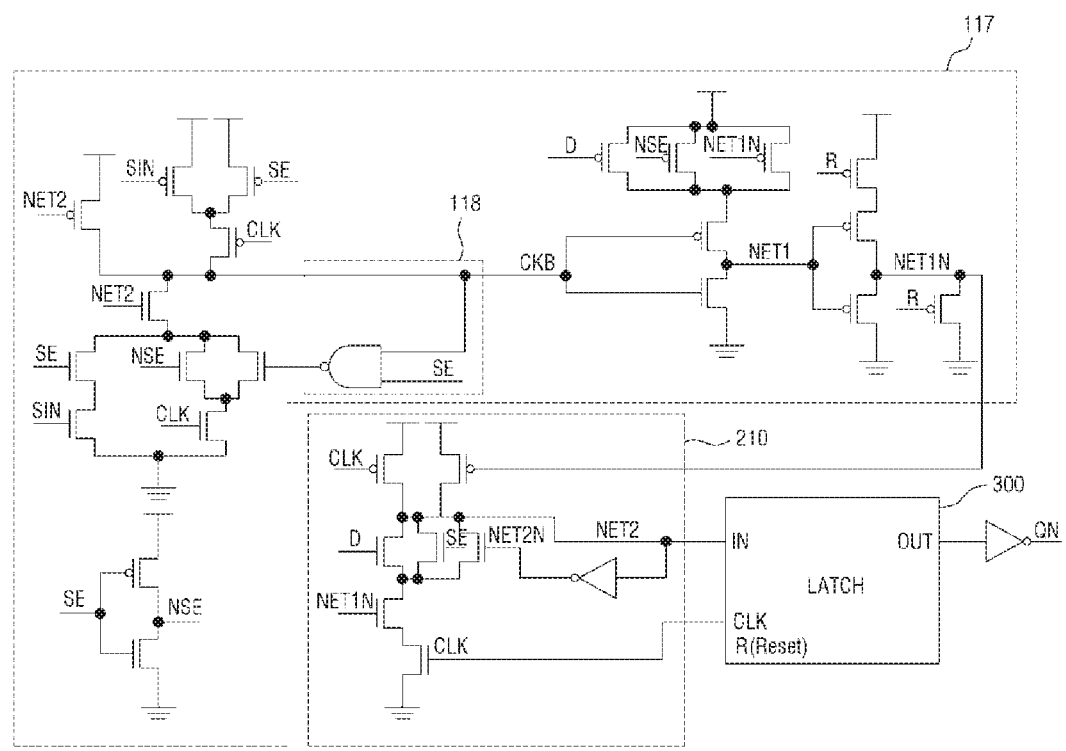
FIG. 9 is a circuit diagram of a semiconductor circuit according to some example embodiments of inventive concepts.

FIG. 9 is a circuit diagram of another semiconductor circuit according to some example embodiments of inventive concepts. The semiconductor circuit shown in FIG. 9 is similar to the semiconductor circuit shown in FIG. 8. Thus, repeated descriptions of the same details as those of the example embodiment shown in FIG. 8 will be omitted.

Referring to FIG. 9, the semiconductor circuit includes a first circuit 117, a second circuit 210, and a latch circuit 300.

As with the first circuit 115 shown in FIG. 8, the first circuit 117 includes a circuit operating as a scan test path. Accordingly, the first circuit 117 may perform a scan test operation using the added scan test path while reducing and/or minimizing a change in the data path. The first circuit 117 further includes a gate circuit 118. The gate circuit 118 receives a scan enable signal SE and an inverted clock signal CKB as inputs, and performs a NAND operation. The gate circuit 118 is implemented as a NAND gate circuit modified from the NMOS shown in FIG. 7, at which the node NET1 discharging the inverted clock signal CKB and the node NSE are connected in parallel.

Figure 10:
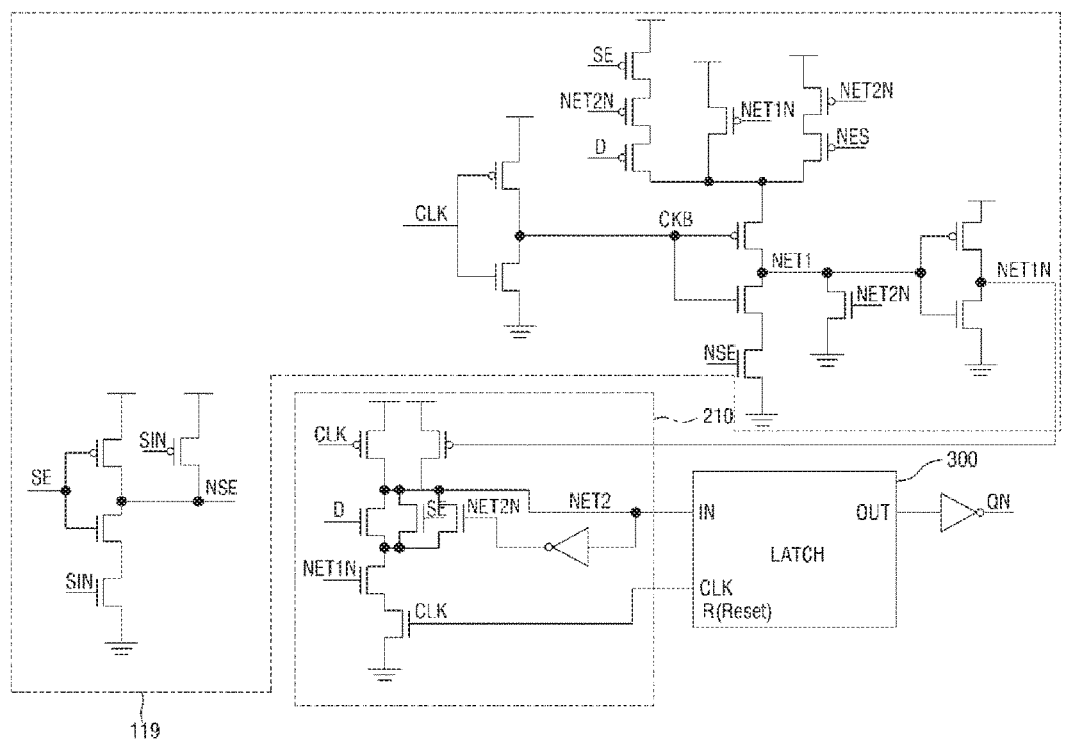
FIG. 10 is a circuit diagram of a semiconductor circuit according to some example embodiments of inventive concepts.

FIG. 10 is a circuit diagram of yet another semiconductor circuit according to some example embodiments of inventive concepts. For brevity, repeated descriptions of the same details as those of the example embodiments discussed above will be omitted.

Referring to FIG. 10, the semiconductor circuit according to some example embodiments of inventive concepts includes a first circuit 119, a second circuit 210, and a latch circuit 300.

The first circuit 119 further includes a circuit operating as a scan test path. Accordingly, the first circuit 119 may perform a scan test operation using the added scan test path while reducing and/or minimizing a change in the data path. In addition, the first circuit 119 includes a separate inverter outputting an output signal NSE inverted to a scan enable signal SE.

Figure 11:
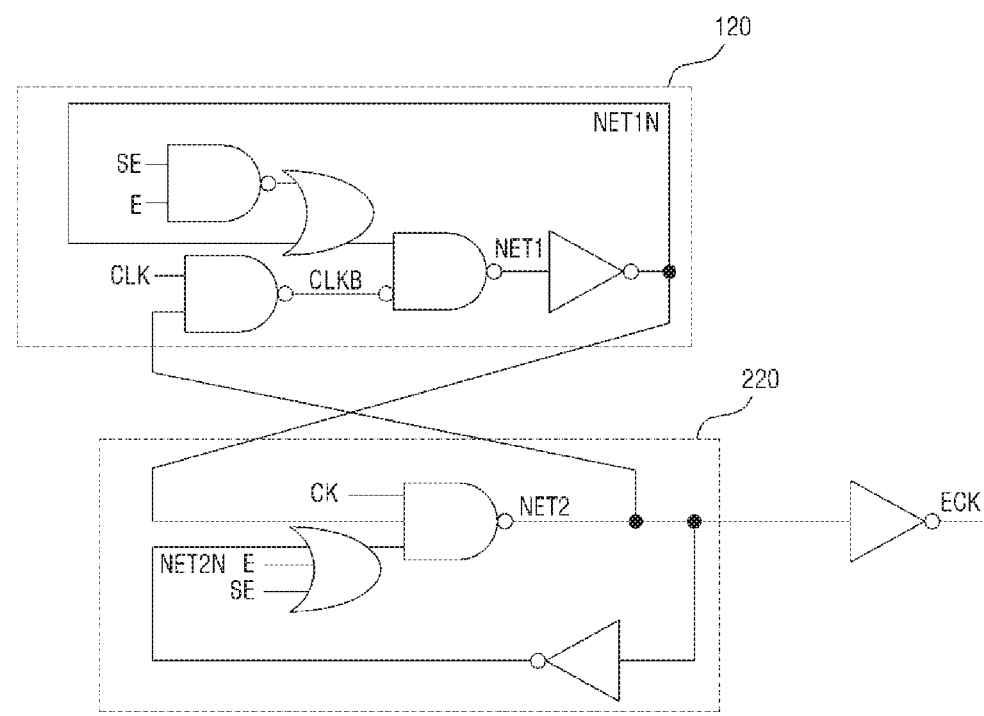
FIG. 11 is a block diagram of a semiconductor circuit according to some example embodiments of inventive concepts.
Figure 12:
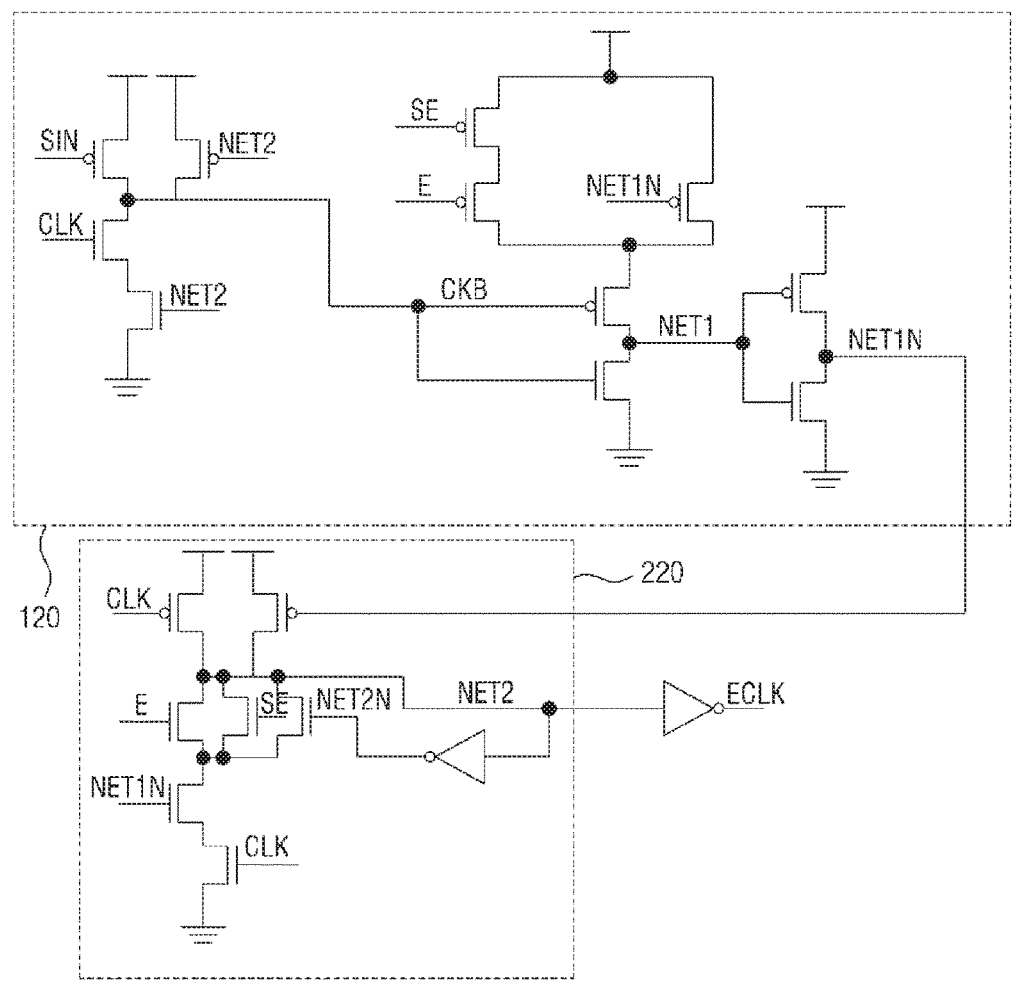
FIG. 12 is a circuit diagram of a semiconductor circuit according to some example embodiments of inventive concepts.

FIG. 11 is a block diagram of another semiconductor circuit according to some example embodiments of inventive concepts, and FIG. 12 is a circuit diagram of the semiconductor circuit shown in FIG. 11. For brevity, repeated descriptions of the same details as those of the example embodiments discussed above will be omitted.

Referring to FIGS. 11 and 12, the semiconductor circuit according to some example embodiments of inventive concepts includes a first circuit 120 and a second circuit 220.

Referring to FIG. 11, the semiconductor circuit does not include a latch circuit, and thus, may function as an integrated clock gating circuit, rather than as a flip-flop circuit. In addition, the first circuit 120 further includes a circuit operating as a scan test path. Accordingly, the first circuit 120 may perform a scan test operation using the added scan test path while reducing and/or minimizing a change in the data path.

In FIG. 12, the circuitry of the integrated clock gating circuit with a scan test path added thereto is illustrated at the transistor level.

Figure 13:
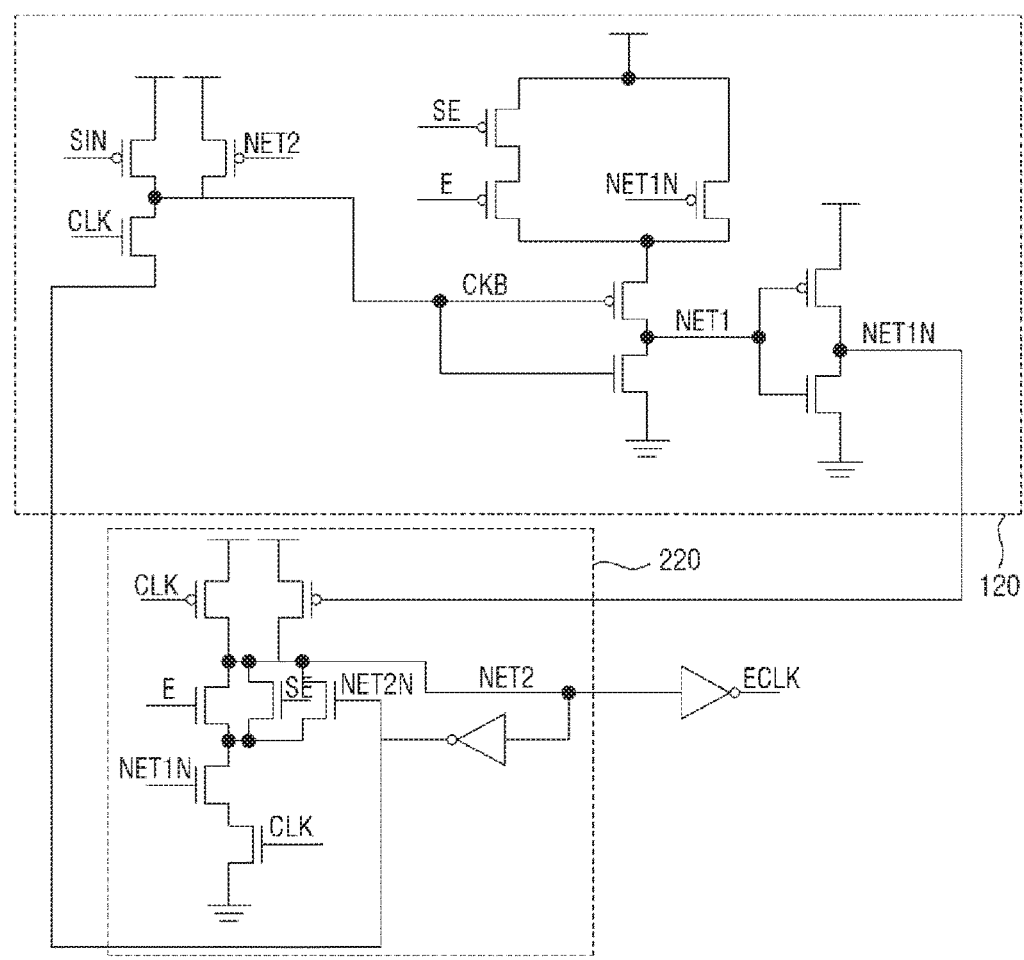
FIG. 13 is a circuit diagram of a semiconductor circuit according to some example embodiments of inventive concepts.

FIG. 13 is a circuit diagram of another semiconductor circuit according to some example embodiments of inventive concepts. For brevity, repeated descriptions of the same details as those of the example embodiments discussed above will be omitted.

Referring to FIG. 13, the semiconductor circuit includes a first circuit 120 and a second circuit 220. Compared to the semiconductor circuit shown in FIG. 12, the semiconductor circuit includes a merged circuit of two transistors to which a voltage level of a second node NET2 is input.

Figure 14:
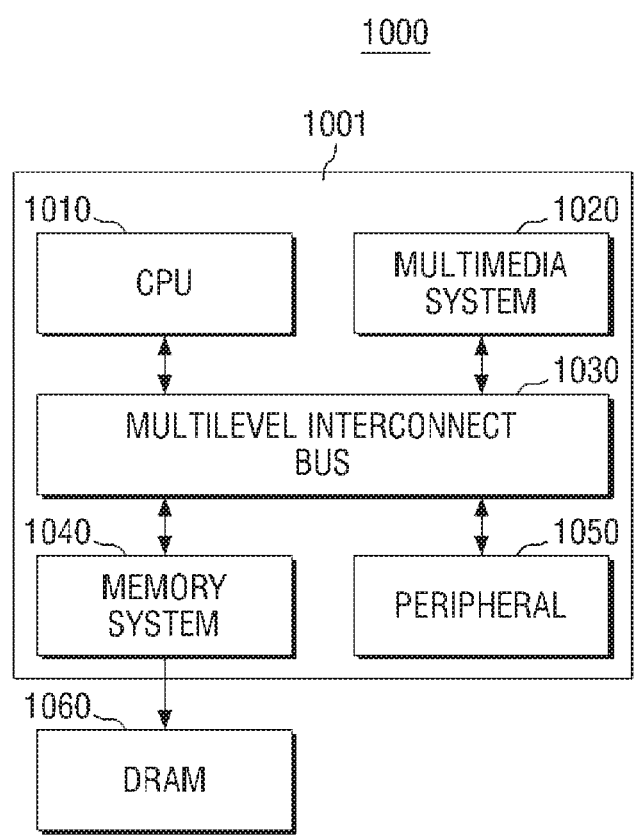
FIG. 14 is a block diagram of a system-on-chip (SoC) system including one or more semiconductor circuits according to some example embodiments of inventive concepts.

FIG. 14 is a block diagram of a system-on-chip (SoC) system including one or more semiconductor circuits according to example embodiments.

Referring to FIG. 14, the SoC system 1000 includes an application processor 1001 and a dynamic random access memory (DRAM) 1060.

The application processor 1001 may include a central processing unit (CPU) 1010, a multimedia system 1020, a multilevel interconnect bus (BUS) 1030, a memory system 1040, and a peripheral circuit 1050.

The CPU 1010 may perform operations required to drive the SoC system 1000. In some example embodiments, the CPU 1010 may be configured in a multi-core environment including a plurality of cores.

The multimedia system 1020 may be used in performing a variety of multimedia functions in the SoC system 1000. The multimedia system 1020 may include a 3D engine module, a video codec, a display system, a camera system, a post-processor, etc.

The bus 1030 may be used in performing data communication among the CPU 1010, the multimedia system 1020, the memory system 1040, and/or the peripheral circuit 1050. In some example embodiments, the bus 1030 may have a multi-layered structure. In more detail, examples of the bus 1030 may include a multi-layer advanced high-performance bus (AHB), or a multi-layer advanced eXtensible interface (AXI), but aspects of example embodiments are not limited thereto.

The memory system 1040 may provide environments for high-speed operation by connecting the AP 1001 to an external memory (e.g., the DRAM 1060). In some example embodiments, the memory system 1040 may include a separate controller (e.g., a DRAM controller) for controlling the external memory (e.g., the DRAM 1060).

The peripheral circuit 1050 may provide environments for more smoothly connecting the SoC system 1000 to an external device (e.g., a main board). Accordingly, the peripheral circuit 1050 may include various kinds of interfaces which enable the external device to be compatible with the SoC system 1000 when connected to the SoC system 1000.

The DRAM 1060 may function as a working memory required to operate the AP 1001. In some example embodiments, as shown, the DRAM 1060 may be outside the AP 1001. In more detail, for example, the DRAM 1060 may be packaged with the AP 1001 in the form of a package on package (PoP).

At least one component of the SoC system 1000 may employ one or more semiconductor circuits according to example embodiments.

In addition, the SoC system 1000 may be applied to a personal digital assistant (PDA), a portable computer, a web tablet, a wireless phone, a mobile phone, a digital music player, a memory card, or any electronic product that may transmit and/or receive information in a wireless environment.

Figure 15:
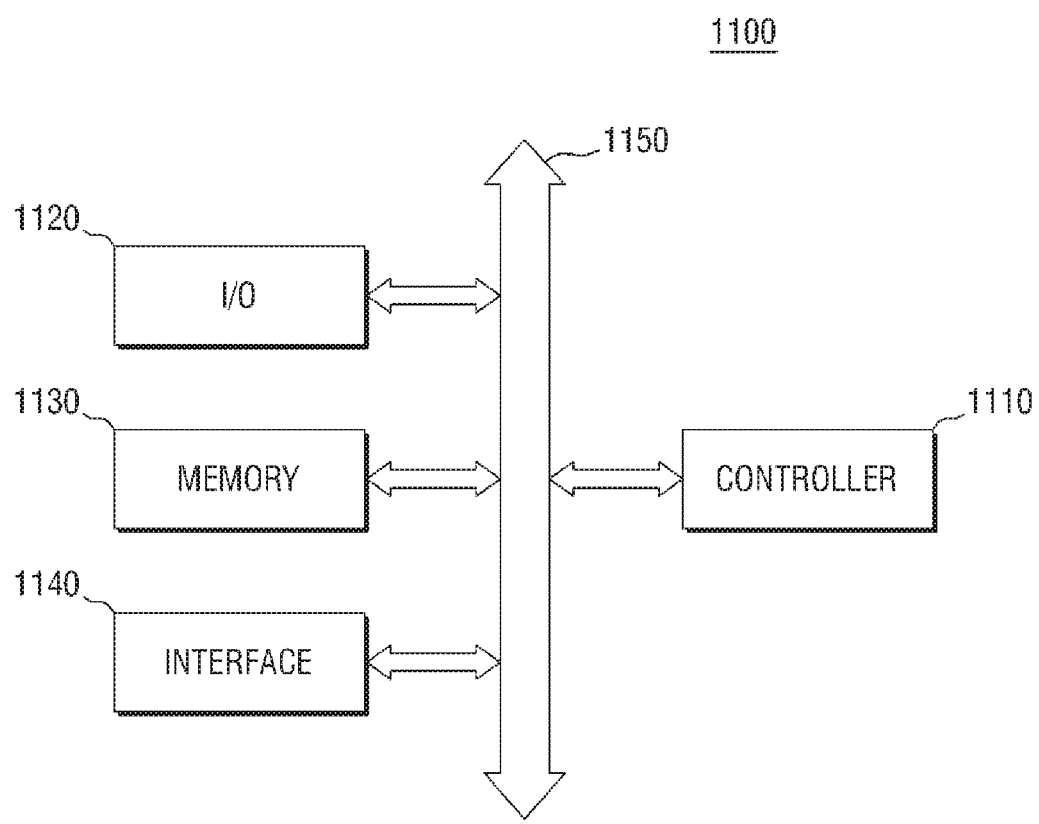
FIG. 15 is a block diagram of an electronic system including one or more semiconductor circuits according to some example embodiments of inventive concepts.

FIG. 15 is a block diagram of an electronic system including one or more semiconductor circuits according to example embodiments.

Referring to FIG. 15, the electronic system 1100 according to example embodiments may include a controller 1110, an input/output device (I/O) 1120, a memory device 1130, an interface 1140, and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements.

The I/O 1120 may include a keypad, a keyboard, a display device, and so on.

The memory device 1130 may store data and/or commands.

The interface 1140 may perform functions of transmitting data to a communication network or receiving data from the communication network. The interface 1140 may be wired or wireless. For example, the interface 1140 may include an antenna and/or a wired/wireless transceiver, and so on.

Although not shown, the electronic system 1100 may further include high-speed DRAM and/or SRAM as a working memory for improving the operation of the controller 1110.

The electronic system 1100 may be applied to a personal digital assistant (PDA), a portable computer, a web tablet, a wireless phone, a mobile phone, a digital music player, a memory card, or any electronic product that may transmit and/or receive information in a wireless environment.

At least one component of the electronic system 1100 may employ one or more of the semiconductor circuits according to example embodiments.

Figure 16:
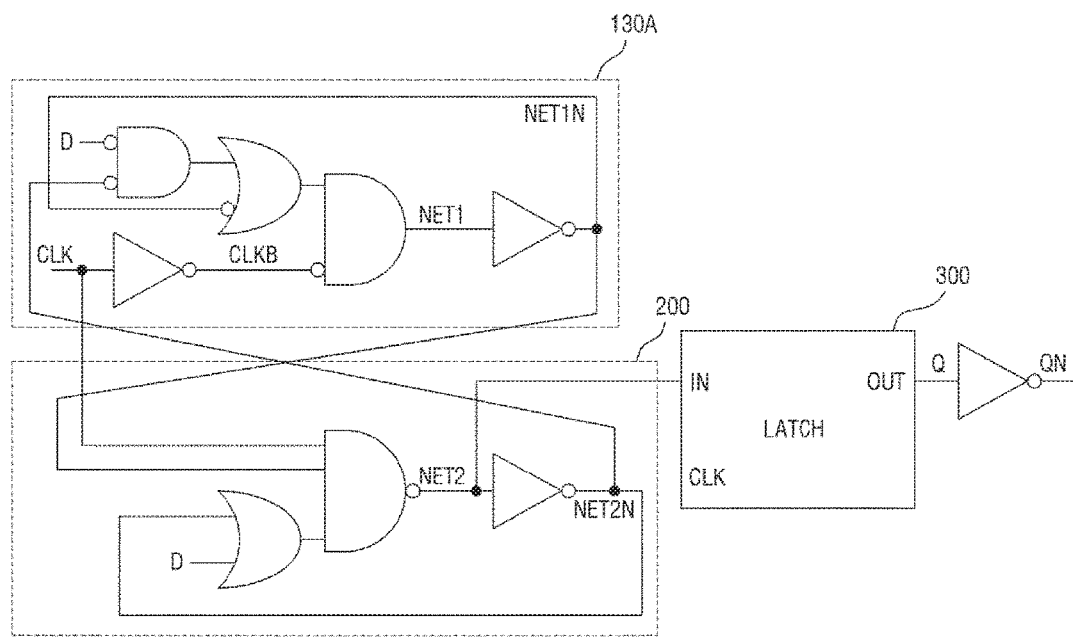
FIG. 16 is a block diagram of a semiconductor circuit according to some example embodiments of inventive concepts.
Figure 17:
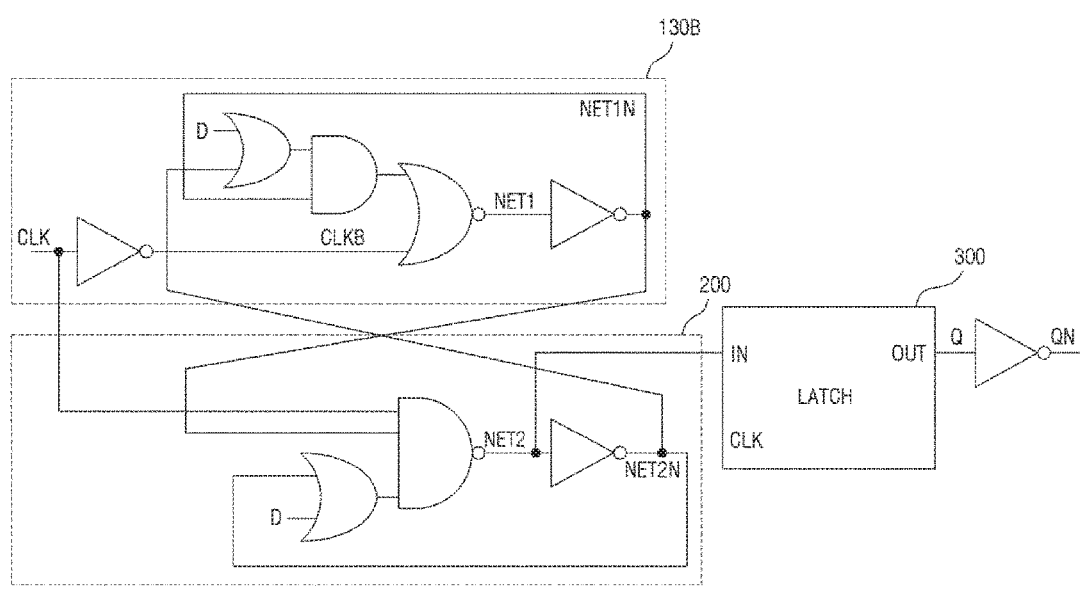
FIG. 17 is a block diagram of a semiconductor circuit according to some example embodiments of inventive concepts.
Figure 18:
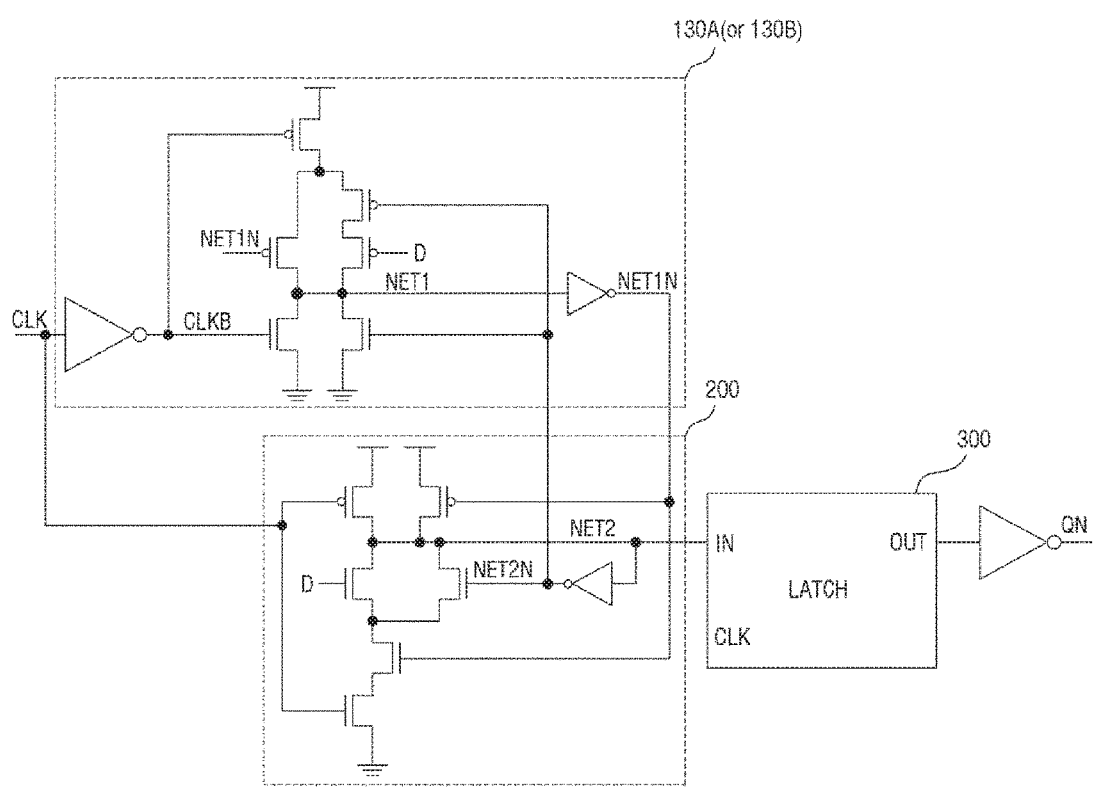
FIG. 18 is a circuit diagram of a semiconductor circuit according to some example embodiments of inventive concepts.

FIGS. 16 and 17 are block diagrams of a semiconductor circuit according to some example embodiments of inventive concepts, and FIG. 18 is a circuit diagram of the semiconductor circuit shown in FIGS. 16 and 17.

Referring to FIG. 16, the semiconductor circuit according to some example embodiments of inventive concepts may include a first circuit 130A, a second circuit 200, and a latch circuit 300. Referring to FIG. 17, the semiconductor circuit according to some example embodiments of inventive concepts may include a first circuit 130B, a second circuit 200, and a latch circuit 300.

The semiconductor circuits shown in FIGS. 16 and 17 are similar to the semiconductor circuit shown in FIG. 1, and thus, repeated descriptions of the same details as those of the example embodiment discussed above will be omitted.

The first circuit 130A in FIG. 16 and the first circuit 130B in FIG. 17 are similar to the first circuit 100 shown in FIG. 1, but the first circuit 130A in FIG. 16 and the first circuit 130B in FIG. 17 may include an additional inverter which receives a clock signal CLK. The first circuit 130A in FIG. 16 and the first circuit 130B in FIG. 17 may perform the same function or a similar function as the first circuit 100 in FIG. 1.

The first circuit 130A and the first circuit 130B in FIGS. 16 and 17 may determine a voltage level of a first node NET1, based on a voltage level of input data D, an inverted value of the voltage level of the first node NET1, a voltage level of a clock signal CLK and an inverted value of a voltage level of a second node NET2.

The second circuit 200 shown in FIGS. 16 and 17 is the same as the second circuit 200 shown in FIG. 1, but a connection between the first circuit 130A or 130B and the second circuit 200 in FIGS. 16 and 17 may be different from a connection between the first circuit 100 and the second circuit 200 in FIG. 1.

The second circuit 200 in FIGS. 16 and 17 may determine the voltage level of the second node NET2, based on the voltage level of input data D, the inverted value of the voltage level of the second node NET2, the voltage level of the clock signal CLK and the inverted value of the voltage level of the first node NET1, The latch circuit 300 shown in FIGS. 16 and 17 is the same as the latch circuit 300 shown in FIG. 1. The latch circuit 300 in FIGS. 16 and 17 may determine a voltage level of an output terminal QN, based on the voltage level of the clock signal CLK and the voltage level of the second node NET2.

FIG. 18 illustrates the semiconductor circuits of FIG. 16 or 17 at the transistor level. The semiconductor circuit shown in FIG. 18 may be a concise alternative circuit of the semiconductor circuit in FIG. 2. The semiconductor circuit in FIG. 18 may perform the same function or a similar function as the semiconductor circuit in FIG. 2.

Figure 19:
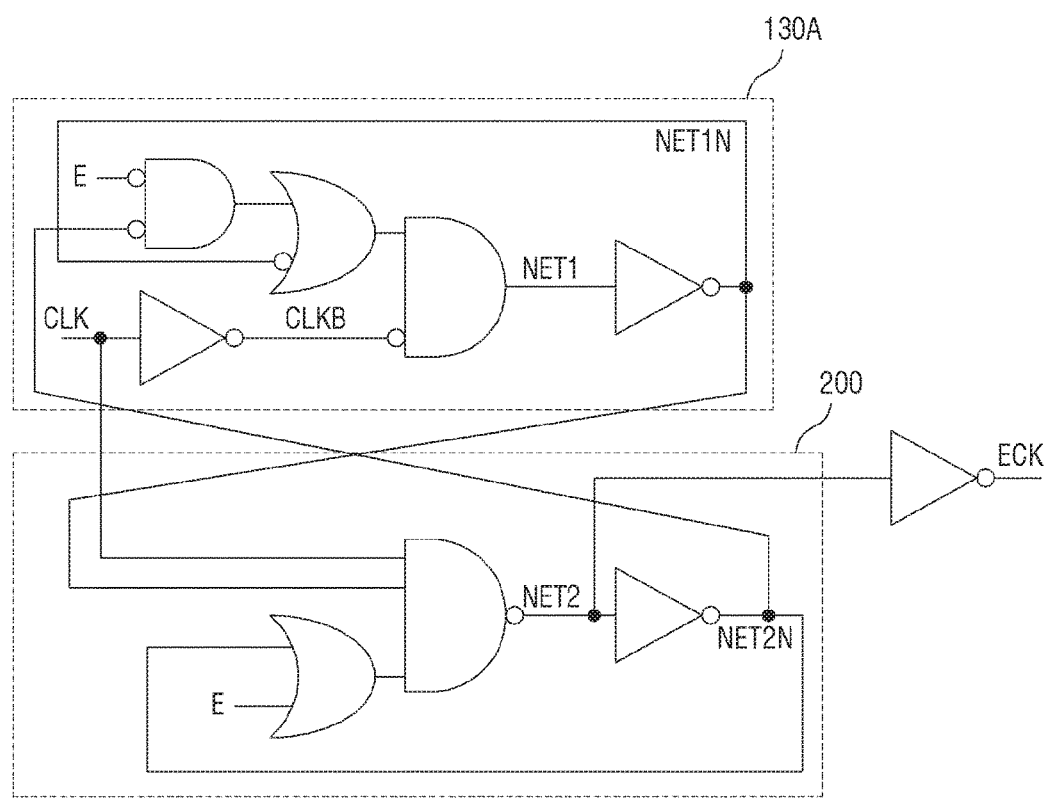
FIG. 19 is a block diagram of a semiconductor circuit according to some example embodiments of inventive concepts.

FIG. 19 is a block diagram of a semiconductor circuit according to some example embodiments of inventive concepts. The semiconductor circuit shown in FIG. 19 may perform the same function or a similar function as the semiconductor circuit shown in FIG. 4.

Referring to FIG. 19, the semiconductor circuit may include a first circuit 130A and a second circuit 200. The semiconductor circuit in FIG. 19 may not include a latch circuit. Therefore, the semiconductor circuit may function as an integrated clock gating circuit rather than as a flip-flop circuit. In the example embodiment shown in FIG. 19, an enable signal E rather than the input data D is input to two gates, and an output of the semiconductor circuit may be a signal ECLK.

Figure 20:
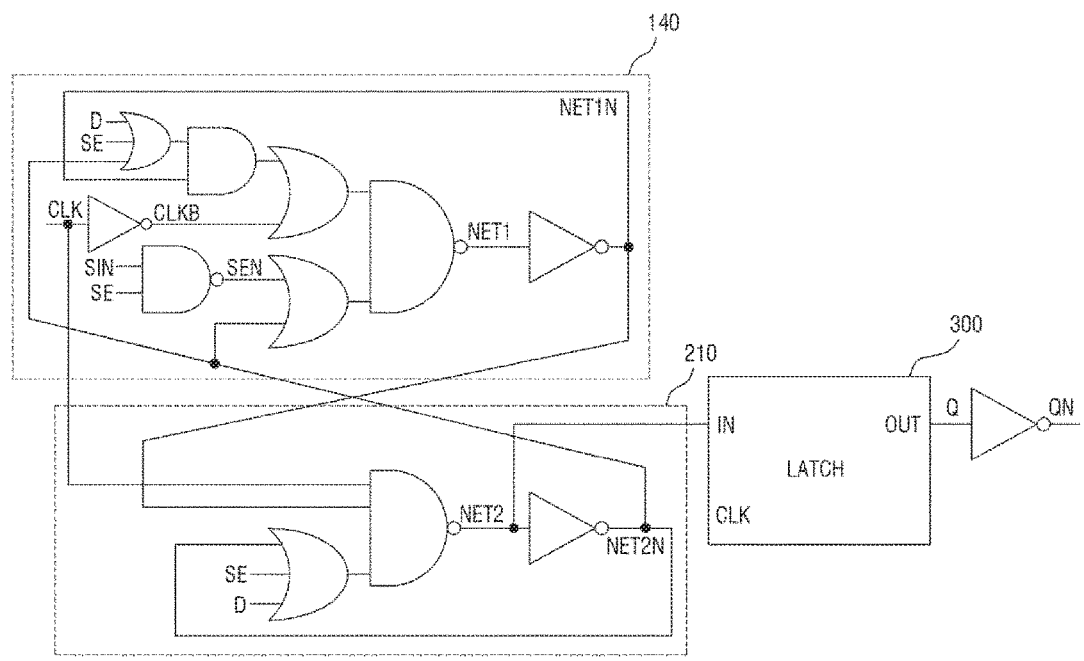
FIG. 20 is a block diagram of a semiconductor circuit according to some example embodiments of inventive concepts.
Figure 21:
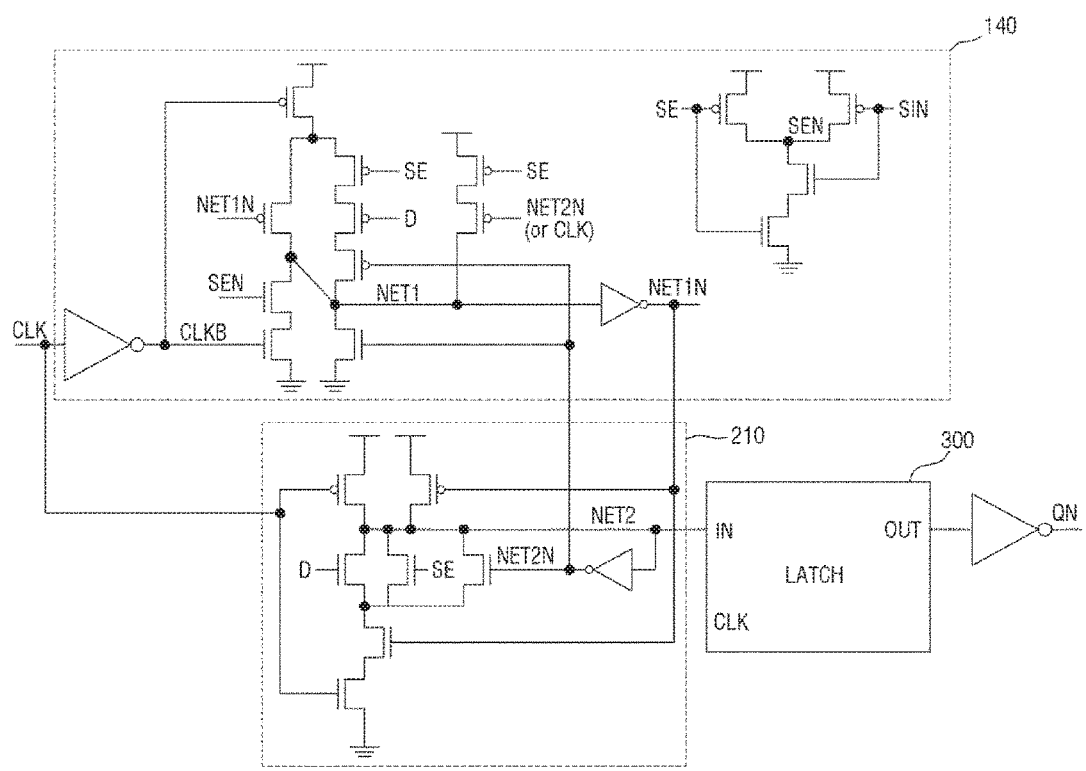
FIG. 21 is a circuit diagram of a semiconductor circuit according to some example embodiments of inventive concepts.

FIG. 20 is a block diagram of a semiconductor circuit according to some example embodiments of inventive concepts, and FIG. 21 is a circuit diagram of a semiconductor circuit shown in FIG. 20.

The semiconductor circuit shown in FIGS. 20 and 21 is similar to the semiconductor circuit shown in FIGS. 6 and 7.

Thus, for brevity, repeated descriptions of the same details as those of the example embodiment shown in FIGS. 6 and 7 will be omitted.

Referring to FIGS. 20 and 21, the semiconductor circuit may include a first circuit 140, a second circuit 210, and a latch circuit 300. The semiconductor circuit in FIGS. 20 and 21 may perform the same function or a similar function as the semiconductor circuit in FIGS. 6 and 7.

The first circuit 140 in FIGS. 20 and 21 is similar to the first circuit 110 in FIGS. 6 and 7, but may be a concise alternative circuit of the first circuit 110 in FIGS. 6 and 7. The first circuit 140 in FIGS. 20 and 21 may perform the same function or a similar function as the first circuit 110 in FIGS. 6 and 7. The first circuit 140 in FIGS. 20 and 21 may include an additional inverter which receives a clock signal CLK.

The second circuit 210 shown in FIGS. 20 and 21 is the same as the second circuit 210 shown in FIGS. 6 and 7, but a connection between the first circuit 140 and the second circuit 210 in FIGS. 20 and 21 may be different from a connection between the first circuit 110 and the second circuit 210 in FIGS. 6 and 7.

The latch circuit 300 shown in FIGS. 20 and 21 is the same as the latch circuit 300 shown in FIGS. 6 and 7.

Figure 22:
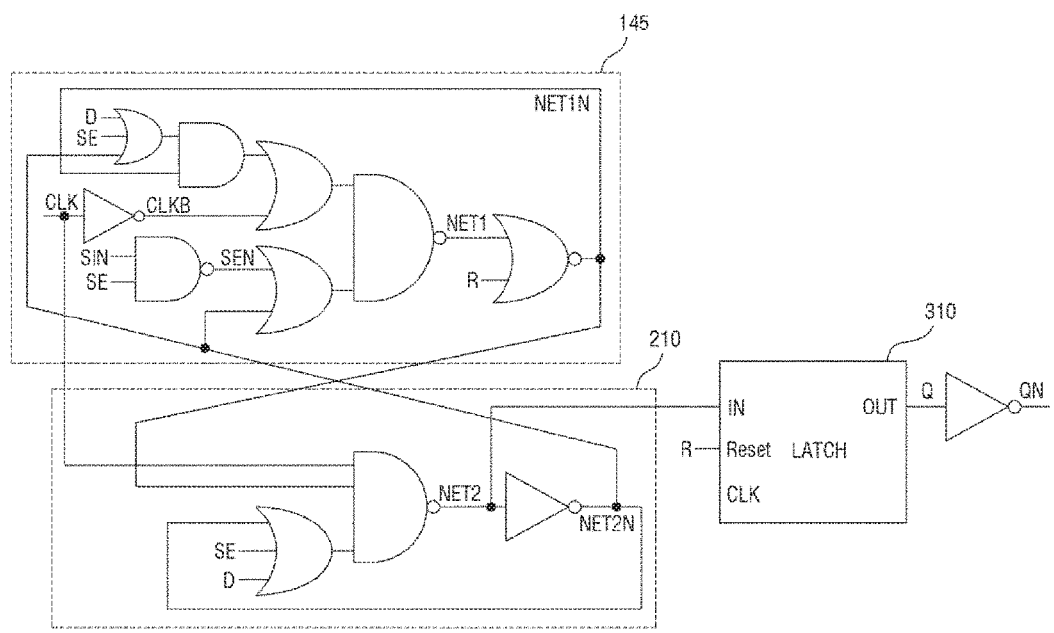
FIG. 22 is a block diagram of a semiconductor circuit according to some example embodiments of inventive concepts.
Figure 23:
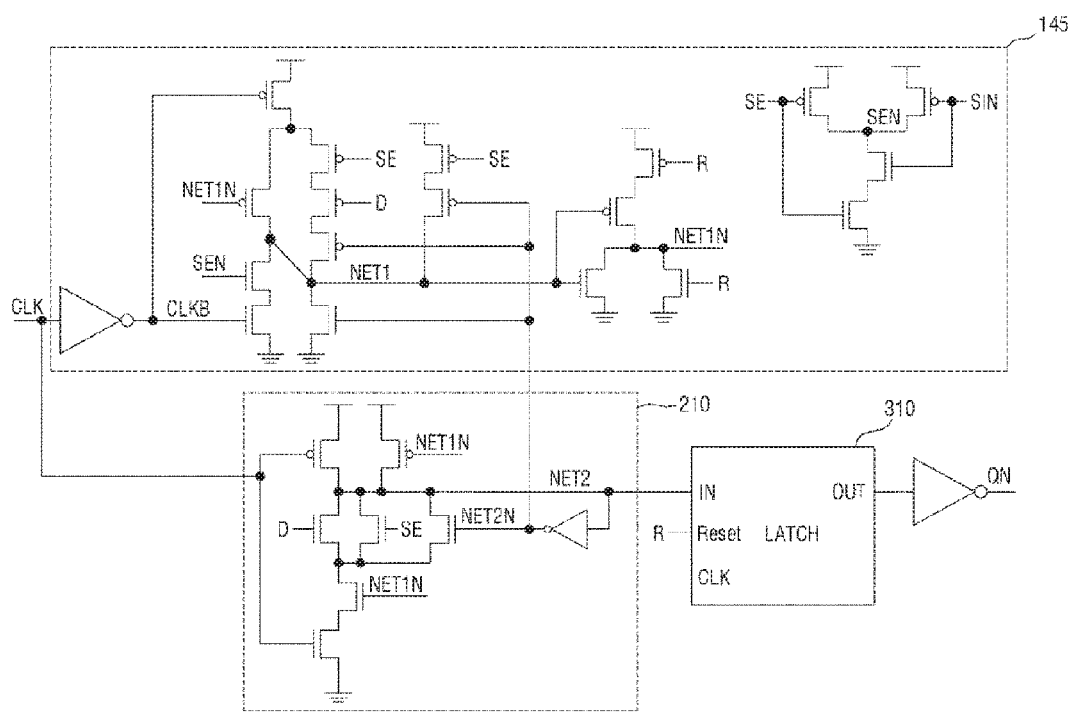
FIG. 23 is a circuit diagram of a semiconductor circuit according to some example embodiments of inventive concepts.

FIG. 22 is a block diagram of a semiconductor circuit according to some example embodiments of inventive concepts, and FIG. 23 is a circuit diagram of a semiconductor circuit shown in FIG. 22.

The semiconductor circuit shown in FIGS. 22 and 23 is similar to the semiconductor circuit shown in FIGS. 6 and 8. The semiconductor circuit in FIGS. 22 and 23 may perform the same function or a similar function as the semiconductor circuit in FIGS. 6 and 8.

Referring to FIGS. 22 and 23, the semiconductor circuit may include a first circuit 145, a second circuit 210, and a latch circuit 310. The semiconductor circuit shown in FIGS. 22 and 23 may receive a reset signal R.

The first circuit 145 in FIG. 22 is similar to the first circuit 110 in FIG. 6, and the first circuit 145 in FIG. 23 is similar to the first circuit 115 in FIG. 8. The first circuit 145 in FIGS. 22 and 23 may perform the same function or a similar function as the first circuit 110 in FIG. 6 and/or the first circuit 115 in FIG. 8. The first circuit 145 in FIGS. 22 and 23 may receive the reset signal R. The first circuit 145 may further include transistors 146a and 146b to which the reset signal R is input to perform a reset operation. The first circuit 145 in FIGS. 22 and 23 may include an additional inverter which receives a clock signal CLK The second circuit 210 shown in FIGS. 22 and 23 is the same as the second circuit 210 shown in FIGS. 6 and 8, but a connection between the first circuit 145 and the second circuit 210 in FIGS. 22 and 23 may be different from a connection between the first circuit 110 (or 115) and the second circuit 210 in FIGS. 6 and 8.

The latch circuit 310 shown in FIGS. 22 and 23 is the same as the latch circuit 300 shown in FIGS. 6 and 8, but the latch circuit 310 shown in FIGS. 22 and 23 receives the reset signal R.

Figure 24:
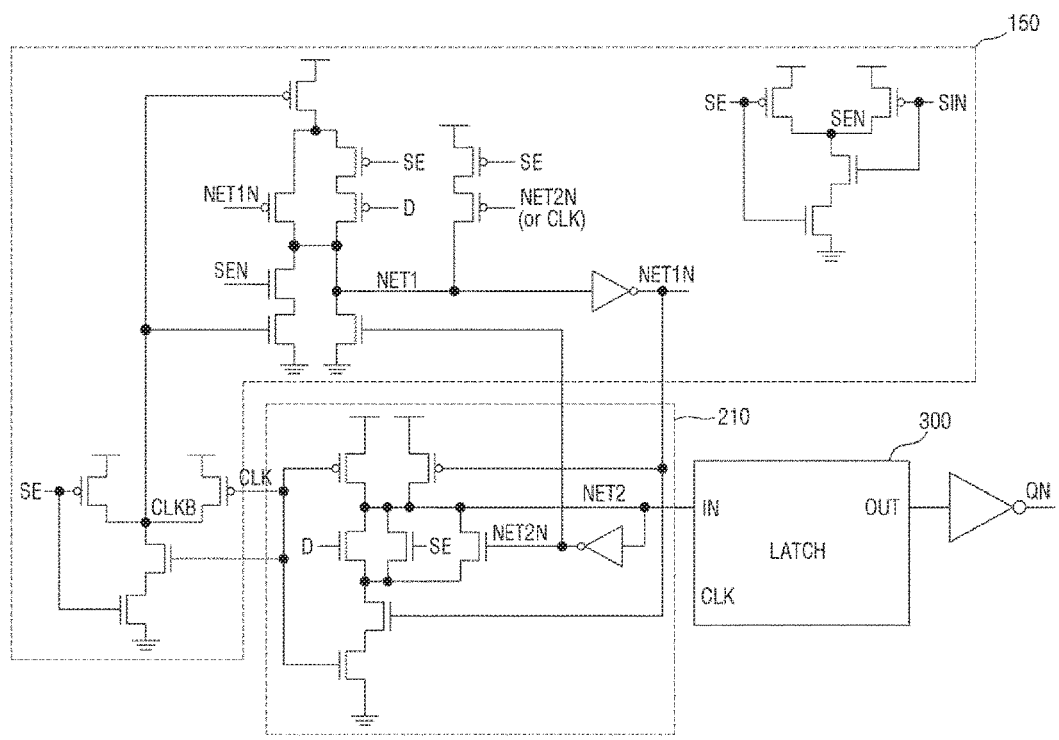
FIG. 24 is a circuit diagram of a semiconductor circuit according to some example embodiments of inventive concepts.

FIG. 24 is a circuit diagram of a semiconductor circuit according to some example embodiments of inventive concepts. The semiconductor circuit shown in FIG. 24 is similar to the semiconductor circuit shown in FIG. 21. The semiconductor circuit in FIG. 24 may perform the same function or a similar function as the semiconductor circuit in FIG. 21.

Referring to FIG. 24, the semiconductor circuit may include a first circuit 150, a second circuit 210, and a latch circuit 300.

The first circuit 150 in FIG. 24 is similar to the first circuit 140 in FIG. 21. The first circuit 150 in FIG. 24 may perform the same function or a similar function as the first circuit 140 in FIG. 21.

The second circuit 210 shown in FIG. 24 is the same as the second circuit 210 shown in FIG. 21, but a connection between the first circuit 150 and the second circuit 210 in FIG. 24 may be different from a connection between the first circuit 140 and the second circuit 210 in FIG. 21.

The latch circuit 300 shown in FIG. 24 is the same as the latch circuit 300 shown in FIG. 21.

Figure 25:
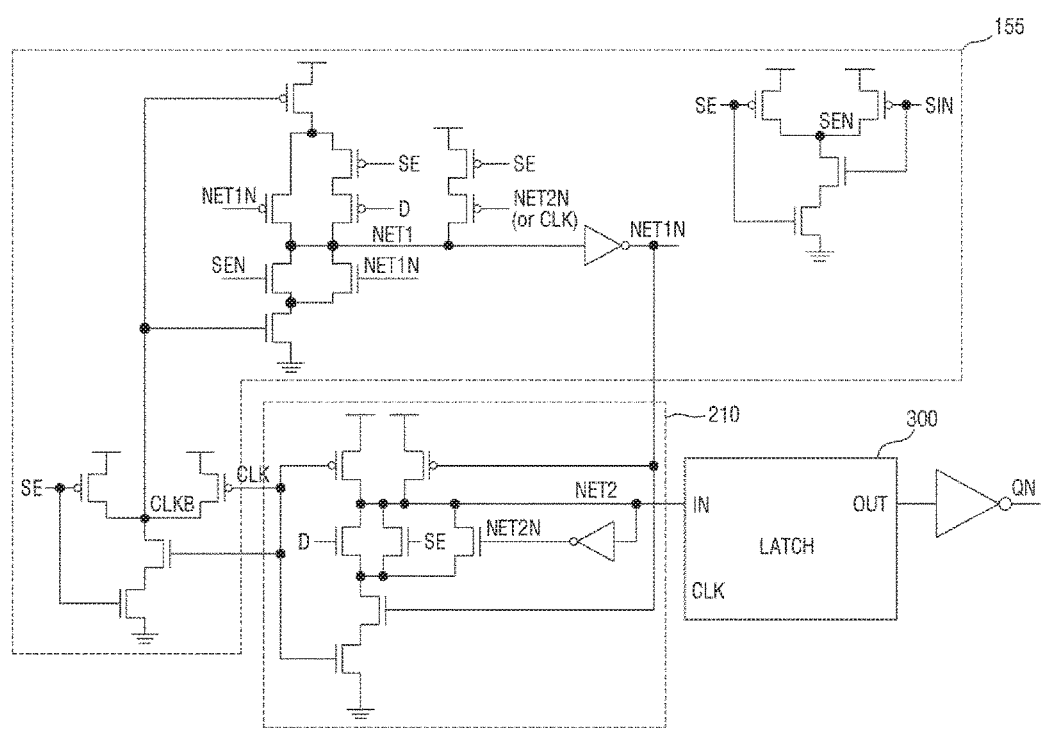
FIG. 25 is a circuit diagram of a semiconductor circuit according to some example embodiments of inventive concepts.

FIG. 25 is a circuit diagram of a semiconductor circuit according to some example embodiments of inventive concepts. The semiconductor circuit shown in FIG. 25 is similar to the semiconductor circuit shown in FIG. 21. The semiconductor circuit in FIG. 25 may perform the same function or a similar function as the semiconductor circuit in FIG. 21.

Referring to FIG. 25, the semiconductor circuit may include a first circuit 155, a second circuit 210, and a latch circuit 300.

The first circuit 155 in FIG. 25 is similar to the first circuit 140 in FIG. 21. The first circuit 155 in FIG. 24 may perform the same function or a similar function as the first circuit 140 in FIG. 21.

The second circuit 210 shown in FIG. 25 is the same as the second circuit 210 shown in FIG. 21, but a connection between the first circuit 155 and the second circuit 210 in FIG. 25 may be different from a connection between the first circuit 140 and the second circuit 210 in FIG. 21.

The latch circuit 300 shown in FIG. 25 is the same as the latch circuit 300 shown in FIG. 21.

While inventive concepts have been particularly shown and described with reference to example embodiments thereof, it will be understood by those of ordinary skill in the art that various changes in form and details may be made therein without departing from the spirit and scope of inventive concepts as defined by the following claims. It is therefore desired that example embodiments be considered in all respects as illustrative and not restrictive, reference being made to the appended claims rather than the foregoing description to indicate the scope of inventive concepts.

What is claimed is:

1. A semiconductor device comprising:
   a first circuit configured to generate a voltage level at a first node, based on a voltage level of input data, an inverted value of the voltage level at the first node, a voltage level of a clock signal and an inverted value of a voltage level at a second node; and
   a second circuit configured to generate the voltage level at the second node, based on the voltage level of input data, the inverted value of the voltage level at the second node, the voltage level of the clock signal, and the inverted value of the voltage level at the first node,
   wherein, when the voltage level of the clock signal is at a first level, a logical level of the first node is different from a logical level of the second node, and
   when the voltage level of the clock signal is at a second level that is different from the first level, the logical level of the first node is the same as the logical level of the second node.

2. The semiconductor device of claim 1, wherein the first circuit includes:
   a first inverter configured to receive the clock signal; and
   a second inverter configured to invert the voltage level of the first node.

3. The semiconductor device of claim 1, wherein the second circuit includes a third inverter configured to receive the voltage level of the second node.

4. The semiconductor device of claim 1, further comprising a latch circuit configured to determine a voltage level of an output terminal, based on the voltage level of the clock signal and the voltage level at the second node.

5. The semiconductor device of claim 4, wherein an output of the second circuit is transferred to the latch circuit.

6. The semiconductor device of claim 4, wherein the first circuit, the second circuit and the latch circuit function as flip-flops.

7. The semiconductor device of claim 1, wherein the second circuit includes:
a first pull-up transistor connected to the second node, and having a gate configured to receive the inverted value of the voltage level at the first node; and
a second pull-up transistor connected to the second node in parallel with the first pull-up transistor, and having a gate configured to receive the clock signal.

8. The semiconductor device of claim 1, wherein the first circuit includes:
a first transistor connected to the first node, and having a gate configured to receive the inverted value of the voltage level at the second node; and
a second transistor connected to the first node in parallel with the first transistor, and having a gate configured to receive the inverted value of the voltage level of the clock signal.

9. A semiconductor device comprising:
a first circuit configured to determine a voltage level at a first node, based on a voltage level of input data, an inverted value of the voltage level at the first node, a voltage level of a clock signal and an inverted value of a voltage level at a second node;
a second circuit configured to determine the voltage level at the second node, based on the voltage level of the input data, the inverted value of the voltage level at the second node, the voltage level of the clock signal and the inverted value of the voltage level at the first node; and
a latch circuit configured to determine a voltage level of an output terminal, based on the voltage level of the clock signal and the voltage level at the second node,
wherein, when the voltage level of the clock signal is at a first level, a voltage level of the first node is different from a voltage level of the second node, and the voltage level of the second node is transferred to the output terminal.

10. The semiconductor device of claim 9, wherein the first circuit includes a first inverter configured to receive the clock signal.

11. The semiconductor device of claim 9, wherein the first circuit, the second circuit and the latch circuit function as flip-flops.

12. The semiconductor device of claim 9, wherein, when the voltage level of the clock signal is at a second level that is different from the first level, the voltage level of the first node is the same as the voltage level of the second node.

13. The semiconductor device of claim 9, wherein the first circuit performs a scan test operation using a scan test path.

14. The semiconductor device of claim 9, wherein the first circuit includes:
a first inverter configured to receive the clock signal; and
a second inverter configured to invert the voltage level of the first node.

15. The semiconductor device of claim 9, wherein the second circuit includes:
a first pull-up transistor connected to the second node, and having a gate configured to receive the inverted value of the voltage level at the first node;
a second pull-up transistor connected to the second node in parallel with the first pull-up transistor, and having a gate configured to receive the clock signal;
a first pull-down transistor connected to the second node, and having a gate configured to receive the inverted value of the voltage level at the second node; and
a second pull-down transistor connected to the second node, and having a gate configured to receive the input data.

16. A semiconductor circuit comprising:
a first circuit configured to output a first output signal, based on input data, a clock signal, an inverted second output signal and an inverted first output signal; and
a second circuit configured to output a second output signal, based on the input data, the inverted first output signal, the clock signal and the inverted second output signal,
wherein the second circuit is configured to output the second output signal, and
the second output signal has either a logic level different from a logic level of the first output signal, or the same logic level as the first output signal, based on a logical level of the clock signal.

17. The semiconductor circuit of claim 16, wherein the first circuit includes a first inverter configured to receive the clock signal.

18. The semiconductor circuit of claim 16, further comprising:
a latch circuit configured to determine a voltage level of an output terminal, based on the voltage level of the clock signal and the voltage level of the second output signal.

19. The semiconductor circuit of claim 16, wherein the first output signal is a voltage level at a first node in the first circuit.

20. The semiconductor circuit of claim 16, wherein
the second circuit is configured to the second output signal having the logic level different from the logic level of the first output signal in response to the clock signal having a first logic level, and
the second circuit is configured to output the second output signal having the same logic level as the logic level of the first output signal in response to the clock signal having a second logic level that is different from the first logic level.

* * * * *